United States Patent
Costa et al.

(10) Patent No.: US 8,680,947 B1
(45) Date of Patent: Mar. 25, 2014

(54) PASSIVE MULTI-BAND DUPLEXER

(75) Inventors: Julio Costa, Oak Ridge, NC (US);
Joshua J. Caron, Madison, NC (US);
Todd Gillenwater, Summerfield, NC (US)

(73) Assignee: RF Micro Devices, Inc., Greensboro, NC (US)

( * ) Notice: Subject to any disclaimer, the term of this patent is extended or adjusted under 35 U.S.C. 154(b) by 811 days.

(21) Appl. No.: 12/843,574

(22) Filed: Jul. 26, 2010

Related U.S. Application Data

(60) Provisional application No. 61/297,172, filed on Jan. 21, 2010, provisional application No. 61/228,447, filed on Jul. 24, 2009.

(51) Int. Cl.
*H03H 7/01* (2006.01)
*H03H 9/46* (2006.01)
*H01P 1/20* (2006.01)

(52) U.S. Cl.
USPC .................... 333/174; 333/101; 333/133

(58) Field of Classification Search
USPC ......... 333/132, 133, 167, 174, 101, 103, 104, 333/105, 186, 187, 189, 193
See application file for complete search history.

(56) References Cited

U.S. PATENT DOCUMENTS

| | | | |
|---|---|---|---|
| 4,628,537 A | | 12/1986 | Shimakata et al. |
| 5,386,203 A | * | 1/1995 | Ishihara .................. 333/129 |
| 5,768,691 A | * | 6/1998 | Matero et al. .............. 455/78 |
| 7,142,884 B2 | * | 11/2006 | Hagn .................... 455/552.1 |
| 7,570,973 B1 | | 8/2009 | Bienek et al. |
| 7,664,475 B2 | * | 2/2010 | Ichihara ................ 455/168.1 |
| 8,072,297 B2 | * | 12/2011 | Toncich et al. ............ 333/174 |
| 2007/0030096 A1 | | 2/2007 | Nishihara et al. |
| 2007/0058748 A1 | | 3/2007 | Kim et al. |
| 2009/0323856 A1 | | 12/2009 | McCallister |
| 2009/0325564 A1 | | 12/2009 | Bienek et al. |
| 2010/0231324 A1 | | 9/2010 | Lee et al. |
| 2010/0321130 A1 | * | 12/2010 | Kim et al. .................. 333/126 |

OTHER PUBLICATIONS

Non-Final Office Action for U.S. Appl. No. 12/959,512, mailed Apr. 24, 2013, 14 pages.
Non-Final Office Action for U.S. Appl. No. 13/372,080, mailed Jun. 28, 2013, 8 pages.
Lakin, K. M. et al., "Wide Bandwidth Thin Film BAW Filters," 2004 IEEE Ultrasonics Symposium Proceedings, Aug. 2004, vol. 1, pp. 407-410.
Non-Final Office Action for U.S. Appl. No. 12/959,512, mailed Oct. 18, 2013, 16 pages.
Final Office Action for U.S. Appl. No. 13/372,080, mailed Nov. 15, 2013, 25 pages.

* cited by examiner

*Primary Examiner* — Dean O Takaoka
*Assistant Examiner* — Alan Wong
(74) *Attorney, Agent, or Firm* — Withrow & Terranova, P.L.L.C.

(57) ABSTRACT

The present disclosure relates to a passive multi-band duplexer having a first bandpass filter and a second bandpass filter. The first bandpass filter includes a first group of sub-band bandpass filters, a first switching circuit, and a first tunable LC bandpass filter. Similarly, the second bandpass filter includes a second group of sub-band bandpass filters, a second switching circuit, and a second tunable LC bandpass filter. A first band of the passive multi-band duplexer, such as a transmit band, is chosen by selecting one of the first group of sub-band bandpass filters and tuning the first tunable LC bandpass filter to the first band. Similarly, a second band of the passive multi-band duplexer, such as a receive band, is chosen by selecting one of the second group of sub-band bandpass filters and tuning the second tunable LC bandpass filter to the second band.

29 Claims, 31 Drawing Sheets

PASSIVE MULTI-BAND DUPLEXER

This application claims the benefit of provisional patent application Ser. No. 61/228,447, filed Jul. 24, 2009, and provisional patent application Ser. No. 61/297,172, filed Jan. 21, 2010, the disclosures of which are hereby incorporated herein by reference in their entireties.

FIELD OF THE DISCLOSURE

Embodiments of the present disclosure relate to radio frequency (RF) duplexers, which may be used in full duplex communications systems.

BACKGROUND OF THE DISCLOSURE

RF communications systems typically communicate using at least one of three different modes of operation. The first mode, called simplex, is a one-way mode of operation, in which a transmitter from one location transmits data to a receiver at another location. For example, a broadcast radio station transmits data one-way to radios. The second mode, called half duplex, is a two-way mode of operation, in which a first transceiver communicates with a second transceiver; however, only one transceiver transmits at a time. Therefore, the transmitter and receiver in a transceiver do not operate simultaneously. For example, certain telemetry systems operate in a send-then-wait-for-reply manner. The third mode, called full duplex, is a simultaneous two-way mode of operation, in which a first transceiver communicates with a second transceiver, and both transceivers may transmit simultaneously; therefore, the transmitter and receiver in a transceiver must be capable of operating simultaneously. In a full duplex transceiver, signals from the transmitter must not interfere with signals received by the receiver; therefore, transmitted signals are at transmit frequencies that are different from received signals, which are at receive frequencies.

The difference between a transmit frequency and a receive frequency is called a duplex frequency. For example, certain cellular telephone systems, such as certain third generation (3G), fourth generation (4G), or later, may operate using a full duplex mode of operation. Full duplex transceivers using a single antenna often use a duplexer to couple the transmitter and receiver to the single antenna. A duplexer enables simultaneous transmission and reception of RF signals by providing a transmit passband that does not overlap with a receive passband, which prevents interference between transmit and receive signals. The non-overlapping area is also known as a guard band. However, since the transmit frequency and the receive frequency must typically both fall within a single RF communications band, the guard band may be fairly narrow. Additionally, some communications protocols, such as those associated with specific Universal Mobile Telecommunications System (UMTS) bands have guard bands that are fairly narrow. Therefore, the transmit and receiver passbands may need to be narrow with steep roll-offs. As a result, certain acoustic technologies, such as surface acoustic wave (SAW) or bulk acoustic wave (BAW) technologies may be used in bandpass filters, such as SAW filters or BAW filters, to provide narrow and steep passbands. Such bandpass filters are often used in duplexers.

As wireless technology evolves, the number and variations of wireless communications protocols increase and may encompass multiple operating modes, multiple frequency bands, and various transmit power levels. As a result, wireless communications products may need to provide support for many such protocols and frequency bands. Tens of frequency bands may need to be supported, such that each frequency band is associated with a dedicated duplexer. As such, many duplexers may be needed to support all of the frequency bands.

In this regard, FIG. 1 shows a multi-band front-end 10 according to the prior art. The multi-band front-end 10 includes an antenna 12, a first single-band duplexer 14, a second single-band duplexer 16, and up to and including an $N^{TH}$ single-band duplexer 18. Antenna switching circuitry is coupled between the antenna 12 and the single-band duplexers 14, 16, 18. The first single-band duplexer 14 receives a first transmit signal TX1 via a transmit port TXP and forwards the first transmit signal TX1 to the antenna 12 via a common port CP. Further, the first single-band duplexer 14 receives a first receive signal RX1 via the common port CP and forwards the first receive signal RX1 to first receive circuitry (not shown) via a receive port RXP. The second single-band duplexer 16 receives and forwards a second transmit signal TX2 to the antenna 12 and receives and forwards a second receive signal RX2 to second receive circuitry (not shown). The $N^{TH}$ single-band duplexer 18 receives and forwards an $N^{TH}$ transmit signal TXN to the antenna 12 and receives and forwards an $N^{TH}$ receive signal RXN to $N^{TH}$ receive circuitry (not shown).

FIG. 2 shows details of the first single-band duplexer 14 illustrated in FIG. 1 according to the prior art. The first single-band duplexer 14 includes a first series transmit SAW resonator 22, a second series transmit SAW resonator 24, a third series transmit SAW resonator 26, a fourth series transmit SAW resonator 28, and a fifth series transmit SAW resonator 30 coupled in series between the common port CP and the transmit port TXP. The first single-band duplexer 14 further includes a first shunt transmit SAW resonator 32 coupled between the junction of the first series transmit SAW resonator 22 and the second series transmit SAW resonator 24 and ground, a second shunt transmit SAW resonator 34 coupled between the junction of the second series transmit SAW resonator 24 and the third series transmit SAW resonator 26 and ground, a third shunt transmit SAW resonator 36 coupled between the junction of the third series transmit SAW resonator 26 and the fourth series transmit SAW resonator 28 and ground, and a fourth shunt transmit SAW resonator 38 coupled between the junction of the fourth series transmit SAW resonator 28 and the fifth series transmit SAW resonator 30 and ground.

Additionally, the first single-band duplexer 14 includes a first series receive SAW resonator 40, a second series receive SAW resonator 42, a third series receive SAW resonator 44, a fourth series receive SAW resonator 46, and a fifth series receive SAW resonator 48 coupled in series between the common port CP and the receive port RXP. The first single-band duplexer 14 further includes a first shunt receive SAW resonator 50 coupled between the junction of the first series receive SAW resonator 40 and the second series receive SAW resonator 42 and ground, a second shunt receive SAW resonator 52 coupled between the junction of the second series receive SAW resonator 42 and the third series receive SAW resonator 44 and ground, a third shunt receive SAW resonator 54 coupled between the junction of the third series receive SAW resonator 44 and the fourth series receive SAW resonator 46 and ground, and a fourth shunt receive SAW resonator 56 coupled between the junction of the fourth series receive SAW resonator 46 and the fifth series receive SAW resonator 48 and ground. The large number of SAW resonators 22, 24, 26, 28, 30, 32, 34, 36, 38, 40, 42, 44, 46, 48, 50, 52, 54, 56 illustrated in FIG. 2 may be needed to provide the narrow with steep roll-offs of the transmit and receiver passbands of the first single-band duplexer 14. However, SAW resonators tend to be relatively expensive and large. Thus, there is a need for duplexer functionality using multiple frequency bands with reduced size and cost.

SUMMARY OF THE EMBODIMENTS

The present disclosure relates to a passive multi-band duplexer having a first bandpass filter and a second bandpass filter. The first bandpass filter includes a first group of sub-band bandpass filters, a first switching circuit, and a first tunable LC bandpass filter coupled in series between a common port and a first port of the passive multi-band duplexer. Similarly, the second bandpass filter includes a second group of sub-band bandpass filters, a second switching circuit, and a second tunable LC bandpass filter coupled in series between the common port and a second port of the passive multi-band duplexer. A first band of the passive multi-band duplexer, such as a transmit band, is chosen by selecting one of the first group of sub-band bandpass filters using the first switching circuit that matches the first band and tuning the first tunable LC bandpass filter to the first band. Similarly, a second band of the passive multi-band duplexer, such as a receive band, is chosen by selecting one of the second group of sub-band bandpass filters using the second switching circuit that matches the second band and tuning the second tunable LC bandpass filter to the second band.

The first and second groups of sub-band bandpass filters may include SAW resonators. However, by using the first and second tunable LC bandpass filters to shape the bandpass filter response of the first and second bandpass filters, fewer SAW resonators may be needed, thereby reducing size and cost. In one embodiment of the passive multi-band duplexer, a first antenna switching circuit is coupled between the first group of sub-band bandpass filters and the common port and a second antenna switching circuit is coupled between the second group of sub-band bandpass filters and the common port. In an alternate embodiment of the passive multi-band duplexer, the first bandpass filter is a transmit bandpass filter and the second bandpass filter is a receive bandpass filter, such that the first antenna switching circuit is coupled between the first group of sub-band bandpass filters and the common port, and a tunable phasing network and the second antenna switching circuit are coupled in series between the second group of sub-band bandpass filters and the common port.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION OF THE PREFERRED EMBODIMENTS

The embodiments set forth below represent the necessary information to enable those skilled in the art to practice the disclosure and illustrate the best mode of practicing the disclosure. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

The present disclosure relates to a passive multi-band duplexer having a first bandpass filter and a second bandpass filter. The first bandpass filter includes a first group of sub-band bandpass filters, a first switching circuit, and a first tunable LC bandpass filter coupled in series between a common port and a first port of the passive multi-band duplexer. Similarly, the second bandpass filter includes a second group of sub-band bandpass filters, a second switching circuit, and a second tunable LC bandpass filter coupled in series between the common port and a second port of the passive multi-band duplexer. A first band of the passive multi-band duplexer, such as a transmit band, is chosen by selecting one of the first group of sub-band bandpass filters using the first switching circuit that matches the first band and tuning the first tunable LC bandpass filter to the first band. Similarly, a second band of the passive multi-band duplexer, such as a receive band, is chosen by selecting one of the second group of sub-band bandpass filters using the second switching circuit that matches the second band and tuning the second tunable LC bandpass filter to the second band.

The first and second groups of sub-band bandpass filters may include surface acoustic wave (SAW) resonators. However, by using the first and second tunable LC bandpass filters to shape the bandpass filter response of the first and second bandpass filters, fewer SAW resonators may be needed, thereby reducing size and cost. In one embodiment of the passive multi-band duplexer, a first antenna switching circuit is coupled between the first group of sub-band bandpass filters and the common port and a second antenna switching circuit is coupled between the second group of sub-band bandpass filters and the common port. In an alternate embodiment of the passive multi-band duplexer, the first bandpass filter is a transmit bandpass filter and the second bandpass filter is a receive bandpass filter, such that the first antenna switching circuit is coupled between the first group of sub-band bandpass filters and the common port, and a tunable phasing network and the second antenna switching circuit are coupled in series between the second group of sub-band bandpass filters and the common port.

Figure 1:
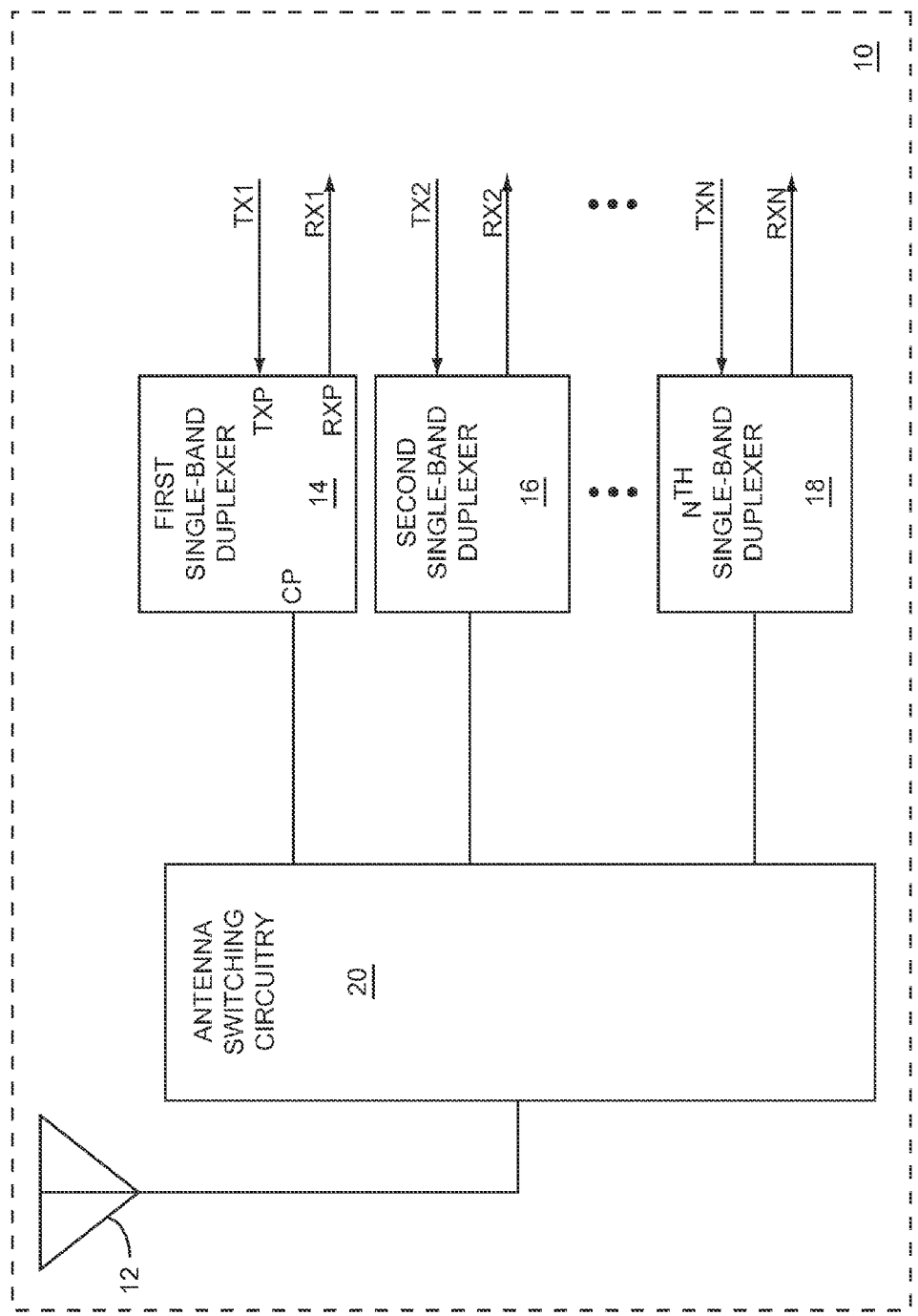
FIG. 1 shows a multi-band front-end according to the prior art.
Figure 2:
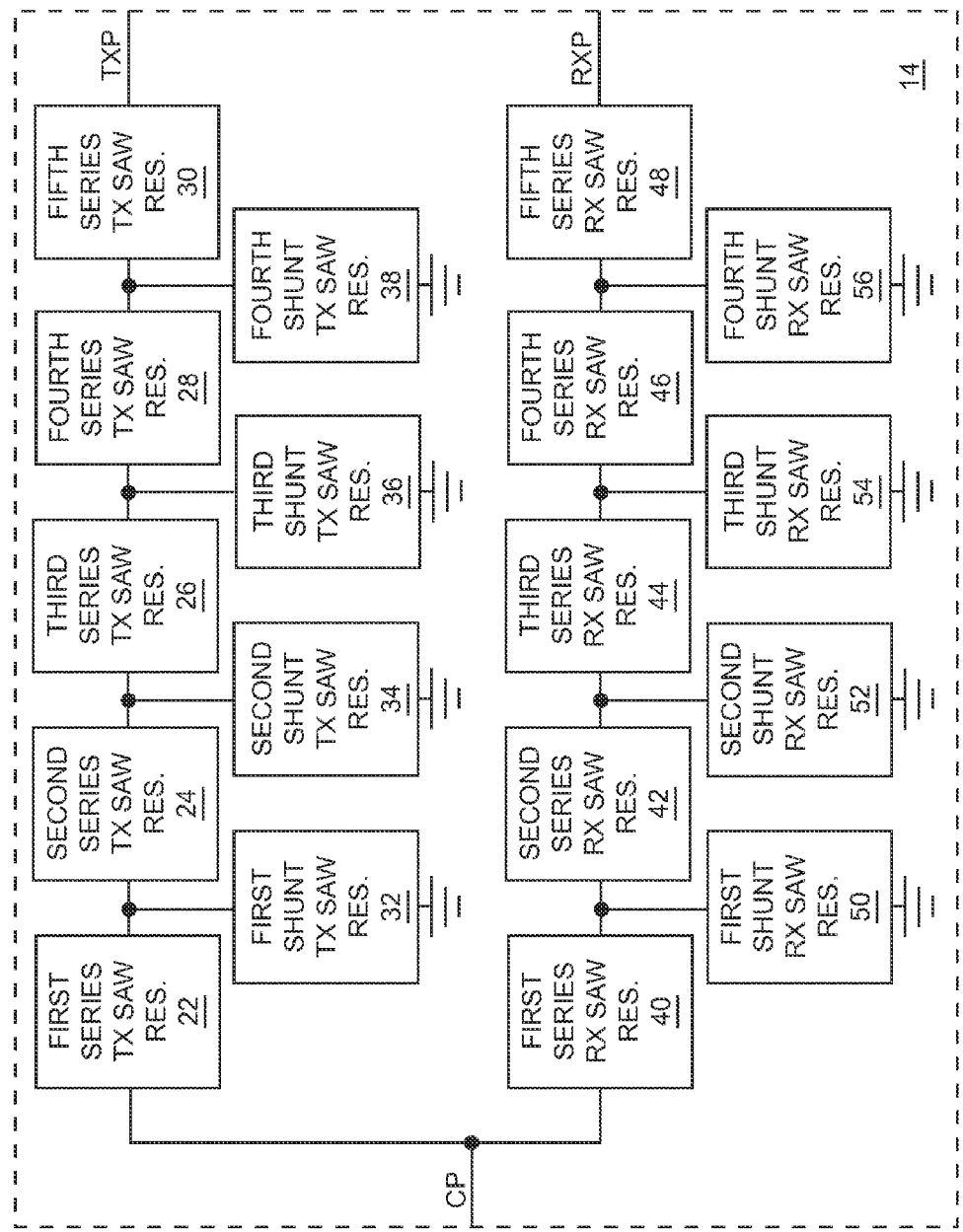
FIG. 2 shows details of a first single-band duplexer illustrated in FIG. 1 according to the prior art.
Figure 3:
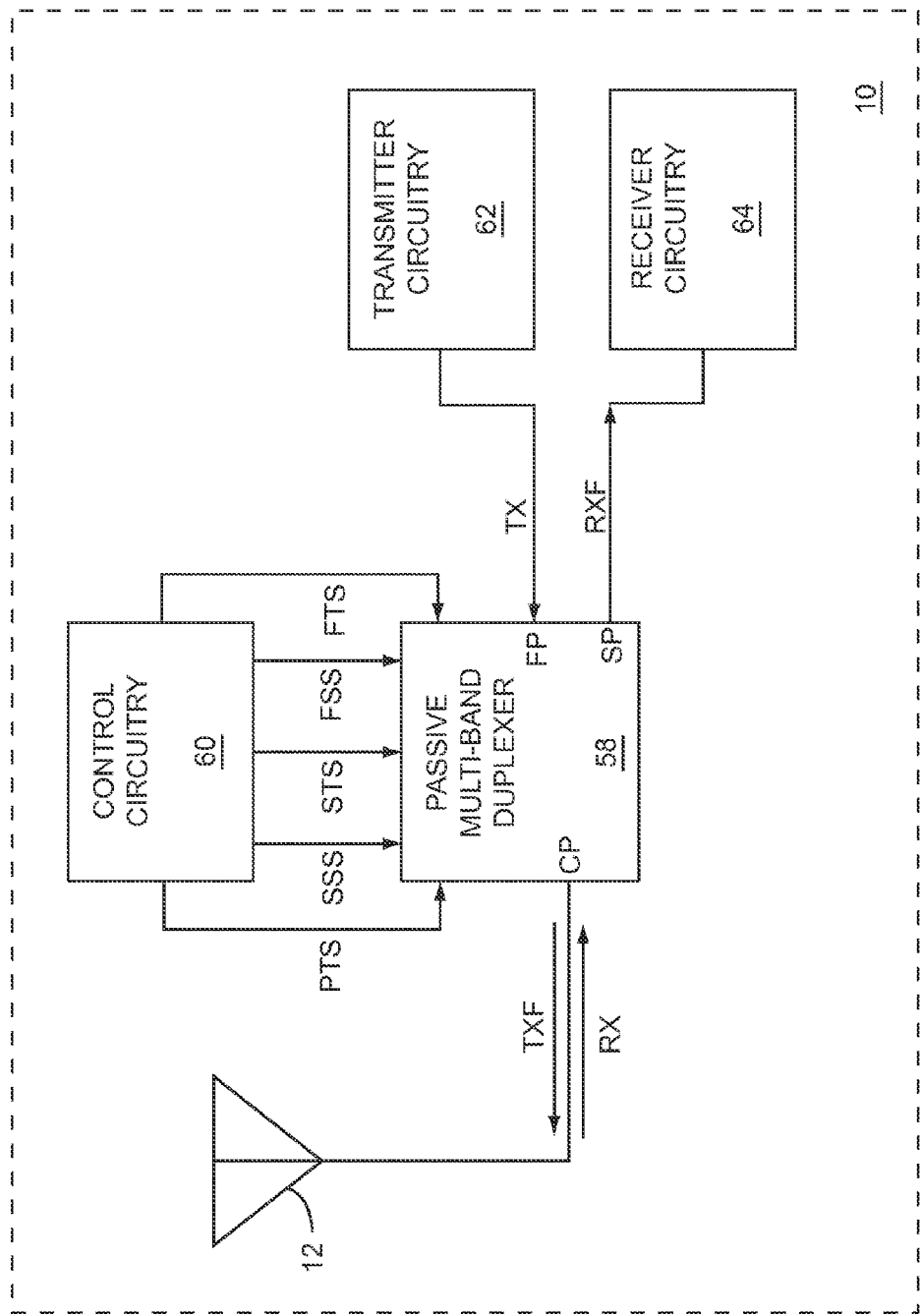
FIG. 3 shows a multi-band front-end according to one embodiment of the present disclosure.

FIG. 3 shows a multi-band front-end 10 according to one embodiment of the present disclosure. The multi-band front-end 10 includes a passive multi-band duplexer 58, control circuitry 60, transmitter circuitry 62, receiver circuitry 64, and the antenna 12. The passive multi-band duplexer 58 has a common port CP, which may be an antenna port, coupled to the antenna 12; a first port FP, which may be a transmitter port, coupled to the transmitter circuitry 62; and a second port SP, which may be a receiver port, coupled to the receiver circuitry 64. The control circuitry 60 provides a phase shift tuning signal PTS, a first switching signal FSS, a second switching signal SSS, a first tuning signal FTS, and a second tuning signal STS to the passive multi-band duplexer 58.

The passive multi-band duplexer 58 receives and filters an RF receive signal RX from the antenna 12 via the antenna port to provide a filtered RF receive signal RXF to the receiver circuitry 64 via the receiver port. The passive multi-band duplexer 58 receives and filters an RF transmit signal TX from the transmitter circuitry 62 via the transmitter port to provide a filtered RF transmit signal TXF to the antenna 12 via the antenna port. The RF receive signal RX and the RF transmit signal TX may be full-duplex signals, such that the RF receive signal RX and the RF transmit signal TX may be received and transmitted simultaneously, respectively.

Figure 4:
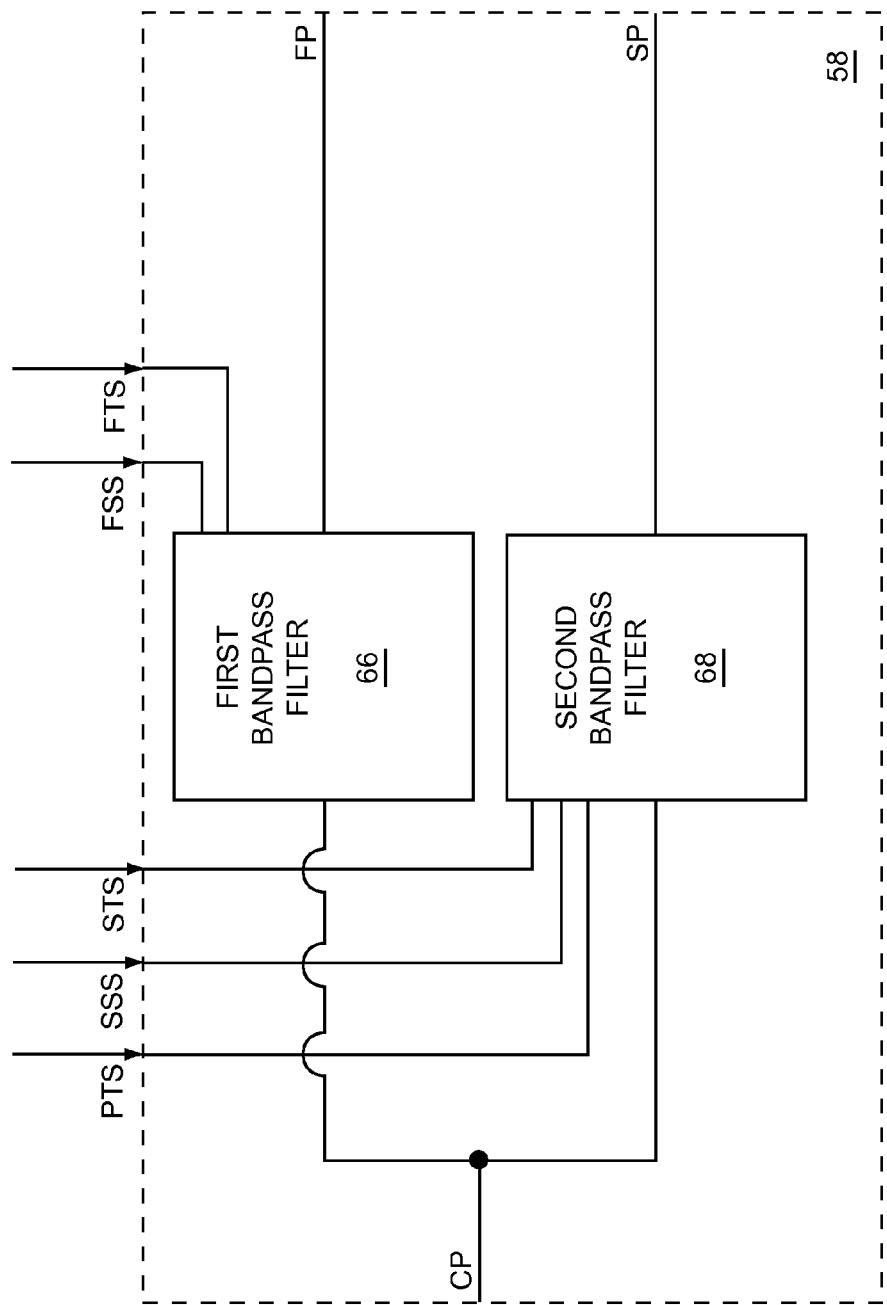
FIG. 4 shows details of a passive multi-band duplexer illustrated in FIG. 3 according to one embodiment of the passive multi-band duplexer.

FIG. 4 shows details of the passive multi-band duplexer 58 illustrated in FIG. 3 according to one embodiment of the passive multi-band duplexer 58. The passive multi-band duplexer 58 includes a first bandpass filter 66 coupled between the common port CP and the first port FP, and includes a second bandpass filter 68 coupled between the common port CP and the second port SP. The first bandpass filter 66 receives the first switching signal FSS and the first tuning signal FTS; and the second bandpass filter 68 receives the phase shift tuning signal PTS, the second switching signal SSS, and the second tuning signal STS.

Figure 5:
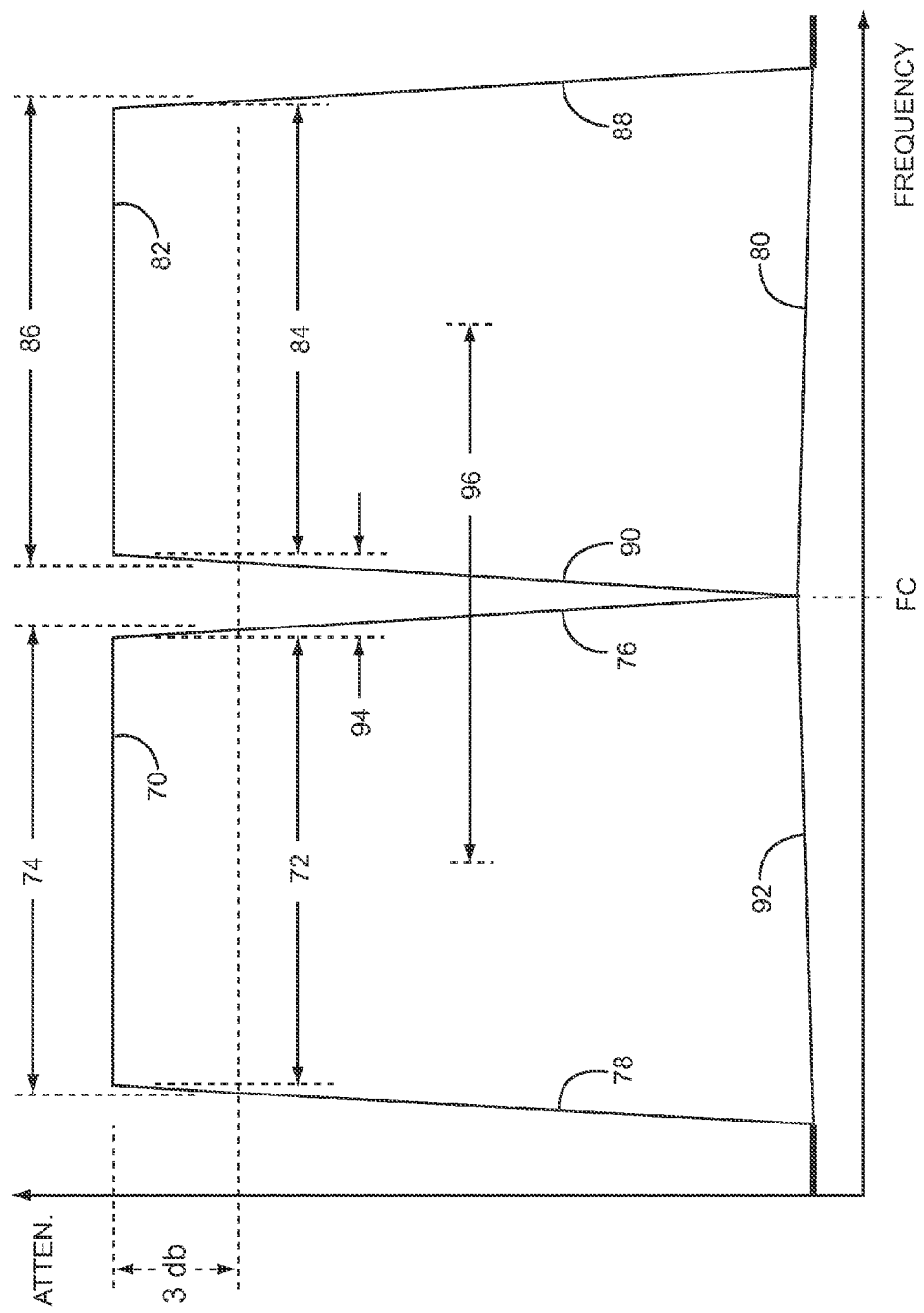
FIG. 5 is a graph showing bandpass filtering characteristics of a first bandpass filter and a second bandpass filter illustrated in FIG. 4 according to one embodiment of the first bandpass filter and the second bandpass filter.

FIG. 5 is a graph showing bandpass filtering characteristics of the first bandpass filter 66 and the second bandpass filter 68 illustrated in FIG. 4 according to one embodiment of the first bandpass filter 66 and the second bandpass filter 68. The first bandpass filter 66 has a first bandpass filter response 70, which includes a first passband 72, a first bandwidth 74, a first upper passband edge 76, a first lower passband edge 78, and a first rejection response 80. The first bandpass filter 66 passes signals inside of its first passband 72 and rejects signals in areas of its first rejection response 80. Similarly, the second bandpass filter 68 includes a second bandpass filter response 82, which includes a second passband 84, a second bandwidth 86, a second upper passband edge 88, a second lower passband edge 90, and a second rejection response 92. The second bandpass filter 68 passes signals inside of its second passband 84 and rejects signals in areas of its second rejection response 92.

Since the first passband 72 is coincident with the second rejection response 92, the second bandpass filter 68 rejects signals falling within the first passband 72. Similarly, since the second passband 84 is coincident with the first rejection response 80, the first bandpass filter 66 rejects signals falling within second passband 84. Therefore, signals within the first passband 72 at the first port FP do not interfere with signals within the second passband 84 at the second port SP, thereby enabling full-duplex operation. Further, the passive multi-band duplexer 58 has a transition band 94 between the first passband 72 and the second passband 84, a center frequency FC between the first passband 72 and the second passband 84, and band spacing 96 between the first passband 72 and the second passband 84.

Figure 6:
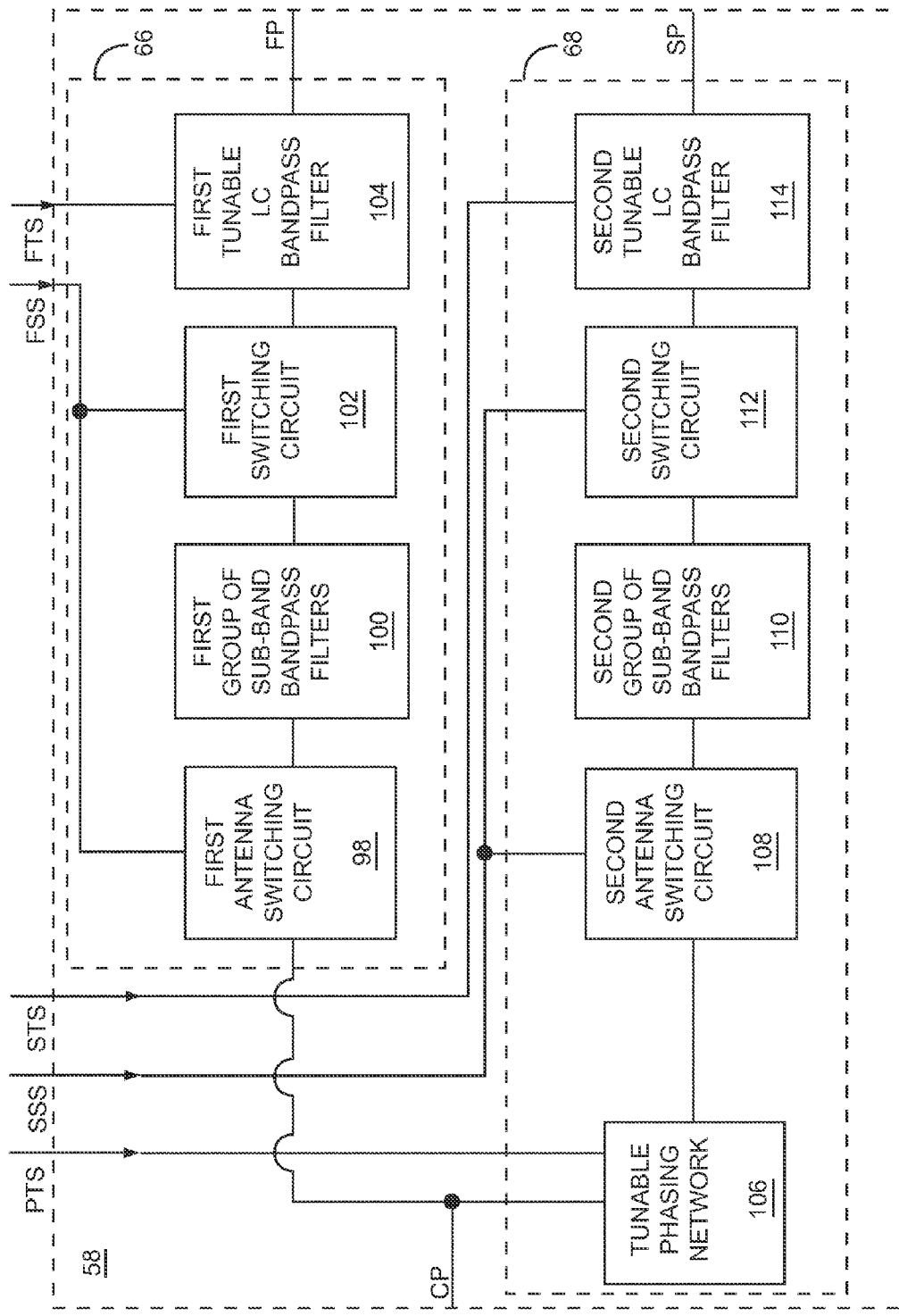
FIG. 6 shows details of the first bandpass filter and the second bandpass filter illustrated in FIG. 4 according to one embodiment of the first bandpass filter and the second bandpass filter.

FIG. 6 shows details of the first bandpass filter 66 and the second bandpass filter 68 illustrated in FIG. 4 according to one embodiment of the first bandpass filter 66 and the second bandpass filter 68. The first bandpass filter 66 includes a first antenna switching circuit 98, a first group of sub-band bandpass filters 100, a first switching circuit 102, and a first tunable LC bandpass filter 104. The first antenna switching circuit 98 is coupled between the common port CP and the first group of sub-band bandpass filters 100. The first switching circuit 102 is coupled between the first group of sub-band bandpass filters 100 and the first tunable LC bandpass filter 104. The first tunable LC bandpass filter 104 is coupled between the first switching circuit 102 and the first port FP.

The first antenna switching circuit 98 and the first switching circuit 102 receive the first switching signal FSS and the first tunable LC bandpass filter 104 receives the first tuning signal FTS. In an alternate embodiment of the first bandpass filter 66, the first antenna switching circuit 98 is omitted, such that the first group of sub-band bandpass filters 100 is coupled directly to the common port CP.

The second bandpass filter 68 includes a tunable phasing network 106, a second antenna switching circuit 108, a second group of sub-band bandpass filters 110, a second switching circuit 112, and a second tunable LC bandpass filter 114. The tunable phasing network 106 is coupled between the common port CP and the second antenna switching circuit 108. The second group of sub-band bandpass filters 110 is coupled between the second antenna switching circuit 108 and the second switching circuit 112. The second tunable LC bandpass filter 114 is coupled between the second switching circuit 112 and the second port SP.

The tunable phasing network 106 receives the phase shift tuning signal PTS, the second antenna switching circuit 108 and the second switching circuit 112 receive the second switching signal SSS, and the second tunable LC bandpass filter 114 receives the second tuning signal STS. The tunable phasing network 106 is used to adjust phase between the first bandpass filter 66 and the second bandpass filter 68 for proper operation. The first bandpass filter response 70 (FIG. 5) of the first bandpass filter 66 may be shaped by the first tunable LC bandpass filter 104. Similarly, the second bandpass filter response 82 (FIG. 5) of the second bandpass filter 68 may be shaped by the second tunable LC bandpass filter 114.

In an alternate embodiment of the second bandpass filter 68, the tunable phasing network 106 is omitted, such that the second antenna switching circuit 108 is coupled directly to the common port CP. In an additional embodiment of the second bandpass filter 68, the second antenna switching circuit 108 is omitted, such that the tunable phasing network 106 is directly coupled to the second group of sub-band bandpass filters 110. In another embodiment of the second bandpass filter 68, both the tunable phasing network 106 and the second antenna switching circuit 108 are omitted, such that the second group of sub-band bandpass filters 110 is directly coupled to the common port CP.

Figure 7:
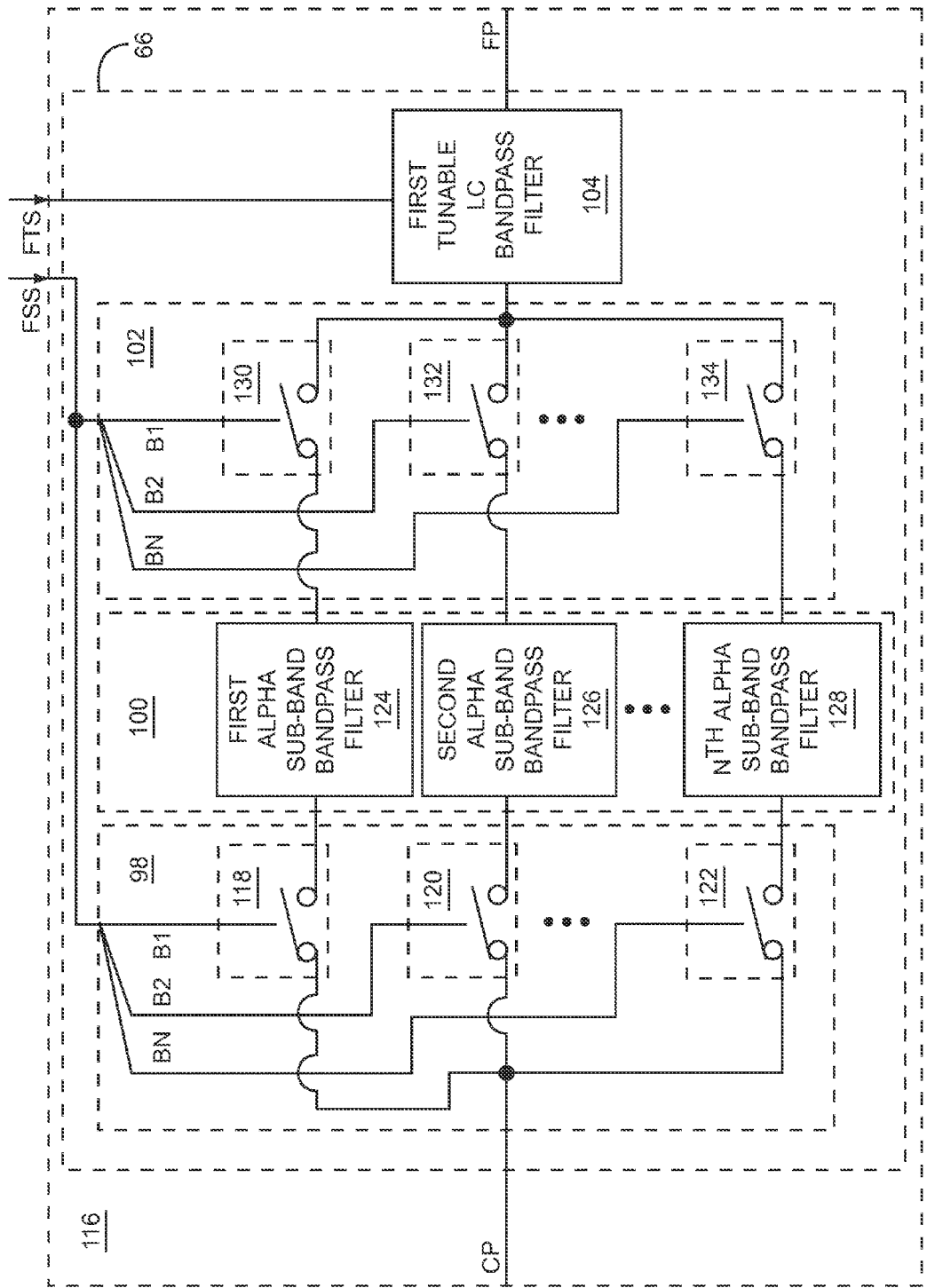
FIG. 7 shows details of a first portion of the passive multi-band duplexer illustrated in FIG. 6 according to one embodiment of the first portion of the passive multi-band duplexer.

FIG. 7 shows details of a first portion 116 of the passive multi-band duplexer 58 illustrated in FIG. 6 according to one embodiment of the first portion 116 of the passive multi-band duplexer 58. The first portion 116 of the passive multi-band duplexer 58 shows details of the first bandpass filter 66. The first antenna switching circuit 98 includes a first alpha antenna switching element 118, a second alpha antenna switching element 120, and up to and including an $N^{TH}$ alpha antenna switching element 122. The first group of sub-band bandpass filters 100 includes a first alpha sub-band bandpass filter 124, a second alpha sub-band bandpass filter 126, and up to and including an $N^{TH}$ alpha sub-band bandpass filter 128. The first switching circuit 102 includes a first alpha switching element 130, a second alpha switching element 132, and up to and including an $N^{TH}$ alpha switching element 134.

The first alpha antenna switching element 118 is coupled between the common port CP and the first alpha sub-band bandpass filter 124. The first alpha switching element 130 is coupled between the first alpha sub-band bandpass filter 124 and the first tunable LC bandpass filter 104. The second alpha antenna switching element 120 is coupled between the common port CP and the second alpha sub-band bandpass filter 126. The second alpha switching element 132 is coupled between the second alpha sub-band bandpass filter 126 and the first tunable LC bandpass filter 104. The $N^{TH}$ alpha antenna switching element 122 is coupled between the common port CP and the $N^{TH}$ alpha sub-band bandpass filter 128. The $N^{TH}$ alpha switching element 134 is coupled between the $N^{TH}$ alpha sub-band bandpass filter 128 and the first tunable LC bandpass filter 104.

When the first alpha sub-band bandpass filter 124 is selected by the control circuitry 60 (FIG. 3), the first alpha antenna switching element 118 and the first alpha switching element 130 are CLOSED, such that the first alpha sub-band bandpass filter 124 is electrically coupled between the common port CP and the first tunable LC bandpass filter 104. Normally, all of the alpha antenna switching elements 120, 122 other than the first alpha antenna switching element 118 and all of the alpha switching elements 132, 134 other than the first alpha switching element 130 are OPEN, such that all of the alpha sub-band bandpass filters 126, 128 other than the first alpha sub-band bandpass filter 124 are isolated from the common port CP and from the first tunable LC bandpass filter 104, respectively.

Similarly, when the second alpha sub-band bandpass filter 126 is selected by the control circuitry 60 (FIG. 3), the second alpha antenna switching element 120 and the second alpha switching element 132 are CLOSED, such that the second alpha sub-band bandpass filter 126 is electrically coupled between the common port CP and the first tunable LC bandpass filter 104. Normally, all of the alpha antenna switching elements 118, 122 other than the second alpha antenna switching element 120 and all of the alpha switching elements 130, 134 other than the second alpha switching element 132 are OPEN, such that all of the alpha sub-band bandpass filters 124, 128 other than the second alpha sub-band bandpass filter 126 are isolated from the common port CP and from the first tunable LC bandpass filter 104, respectively.

Similarly, when the N$^{TH}$ alpha sub-band bandpass filter 128 is selected by the control circuitry 60 (FIG. 3), the N$^{TH}$ alpha antenna switching element 122 and the N$^{TH}$ alpha switching element 134 are CLOSED, such that the N$^{TH}$ alpha sub-band bandpass filter 128 is electrically coupled between the common port CP and the first tunable LC bandpass filter 104. Normally, all of the alpha antenna switching elements 118, 120 other than the N$^{TH}$ alpha antenna switching element 122 and all of the alpha switching elements 130, 132 other than the N$^{TH}$ alpha switching element 134 are OPEN, such that all of the alpha sub-band bandpass filters 124, 126 other than the N$^{TH}$ alpha sub-band bandpass filter 128 are isolated from the common port CP and from the first tunable LC bandpass filter 104, respectively.

A control input to first alpha antenna switching element 118 receives a first bit B1 of the first switching signal FSS. A control input to the second alpha antenna switching element 120 receives a second bit B2 of the first switching signal FSS. A control input to the N$^{TH}$ alpha antenna switching element 122 receives an N$^{TH}$ bit BN of the first switching signal FSS. Similarly, a control input to the first alpha switching element 130 receives the first bit B1 of the first switching signal FSS. A control input to the second alpha switching element 132 receives the second bit B2 of the first switching signal FSS. A control input to the N$^{TH}$ alpha switching element 134 receives the N$^{TH}$ bit BN of the first switching signal FSS. As such, the control circuitry 60 (FIG. 3) selects any of the alpha sub-band bandpass filters 124, 126, 128 by closing or opening appropriate alpha switching elements 118, 120, 122, 130, 132, 134 via the first switching signal FSS. Any or all of the alpha switching elements 118, 120, 122, 130, 132, 134 may be micro-electro-mechanicalsystems (MEMS) switching elements. The first tunable LC bandpass filter 104 receives the first tuning signal FTS, such that the control circuitry 60 (FIG. 3) tunes the first tunable LC bandpass filter 104 via the first tuning signal FTS.

Figure 8:
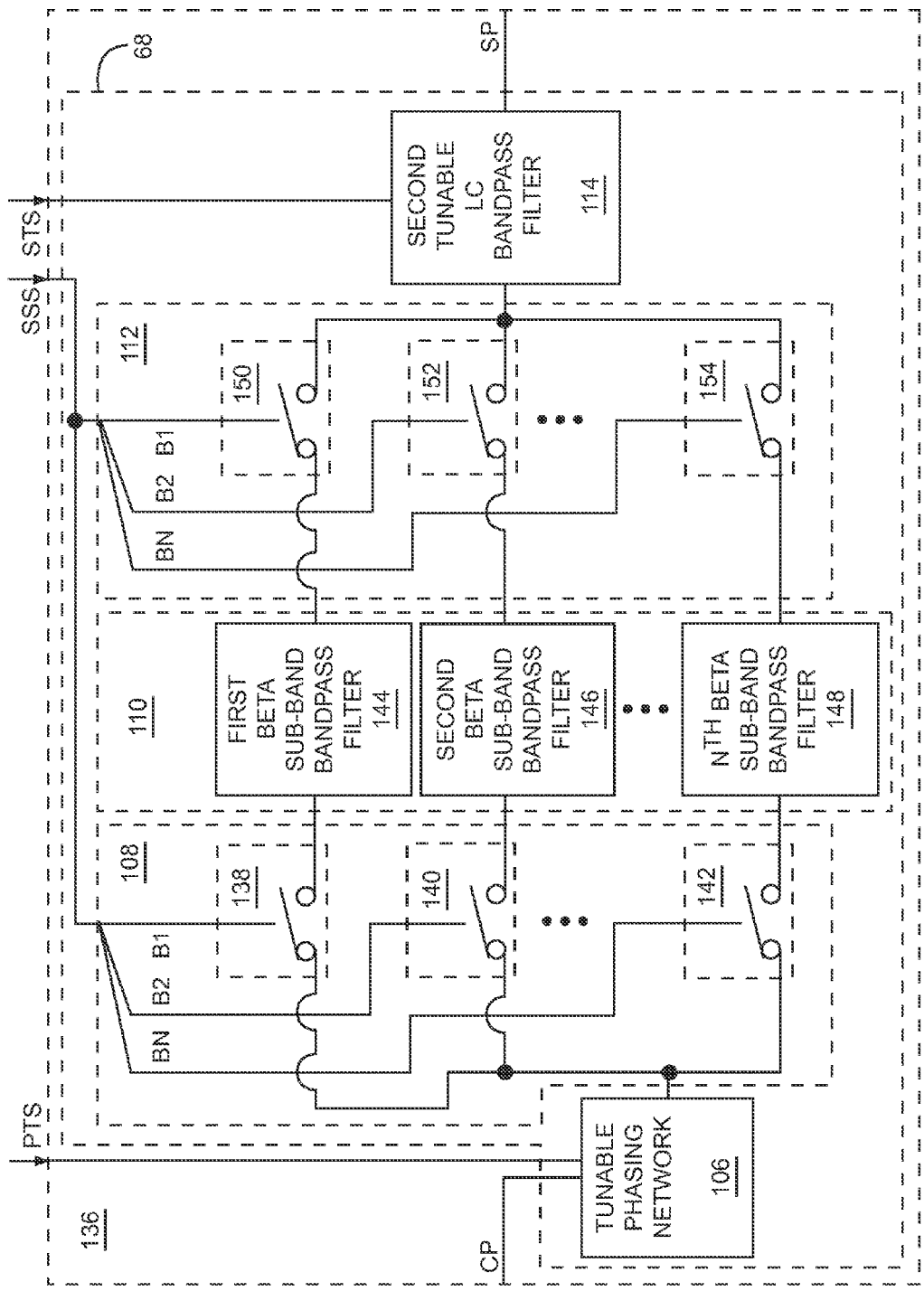
FIG. 8 shows details of a second portion of the passive multi-band duplexer illustrated in FIG. 6 according to one embodiment of the second portion of the passive multi-band duplexer.

FIG. 8 shows details of a second portion 136 of the passive multi-band duplexer 58 illustrated in FIG. 6 according to one embodiment of the second portion 136 of the passive multi-band duplexer 58. The second portion 136 of the passive multi-band duplexer 58 shows details of the second bandpass filter 68. The second antenna switching circuit 108 includes a first beta antenna switching element 138, a second beta antenna switching element 140, and up to and including an N$^{TH}$ beta antenna switching element 142. The second group of sub-band bandpass filters 110 includes a first beta sub-band bandpass filter 144, a second beta sub-band bandpass filter 146, and up to and including an N$^{TH}$ beta sub-band bandpass filter 148. The second switching circuit 112 includes a first beta switching element 150, a second beta switching element 152, and up to and including an N$^{TH}$ beta switching element 154.

The first beta antenna switching element 138 is coupled between the tunable phasing network 106 and the first beta sub-band bandpass filter 144. The first beta switching element 150 is coupled between the first beta sub-band bandpass filter 144 and the second tunable LC bandpass filter 114.

The second beta antenna switching element 140 is coupled between the tunable phasing network 106 and the second beta sub-band bandpass filter 146. The second beta switching element 152 is coupled between the second beta sub-band bandpass filter 146 and the second tunable LC bandpass filter 114. The N$^{TH}$ beta antenna switching element 142 is coupled between the tunable phasing network 106 and the N$^{TH}$ beta sub-band bandpass filter 148. The N$^{TH}$ beta switching element 154 is coupled between the N$^{TH}$ beta sub-band bandpass filter 148 and the second tunable LC bandpass filter 114.

When the first beta sub-band bandpass filter 144 is selected by the control circuitry 60 (FIG. 3), the first beta antenna switching element 138 and the first beta switching element 150 are CLOSED, such that the first beta sub-band bandpass filter 144 is electrically coupled between the common port CP through the tunable phasing network 106 and the second tunable LC bandpass filter 114. Normally, all of the beta antenna switching elements 140, 142 other than the first beta antenna switching element 138 and all of the beta switching elements 152, 154 other than the first beta switching element 150 are OPEN, such that all of the beta sub-band bandpass filters 146, 148 other than the first beta sub-band bandpass filter 144 are isolated from the common port CP and from the second tunable LC bandpass filter 114, respectively.

Similarly, when the second beta sub-band bandpass filter 146 is selected by the control circuitry 60 (FIG. 3), the second beta antenna switching element 140 and the second beta switching element 152 are CLOSED, such that the second beta sub-band bandpass filter 146 is electrically coupled between the common port CP through the tunable phasing network 106 and the second tunable LC bandpass filter 114. Normally, all of the beta antenna switching elements 138, 142 other than the second beta antenna switching element 140 and all of the beta switching elements 150, 154 other than the second beta switching element 152 are OPEN, such that all of the beta sub-band bandpass filters 144, 148 other than the second beta sub-band bandpass filter 146 are isolated from the common port CP and from the second tunable LC bandpass filter 114, respectively.

Similarly, when the N$^{TH}$ beta sub-band bandpass filter 148 is selected by the control circuitry 60 (FIG. 3), the N$^{TH}$ beta antenna switching element 142 and the N$^{TH}$ beta switching element 154 are CLOSED, such that the N$^{TH}$ beta sub-band bandpass filter 148 is electrically coupled between the common port CP through the tunable phasing network 106 and the second tunable LC bandpass filter 114. Normally, all of the beta antenna switching elements 138, 140 other than the N$^{TH}$ beta antenna switching element 142 and all of the beta switching elements 150, 152 other than the N$^{TH}$ beta switching element 154 are OPEN, such that all of the beta sub-band bandpass filters 144, 146 other than the N$^{TH}$ beta sub-band bandpass filter 148 are isolated from the common port CP and from the second tunable LC bandpass filter 114, respectively.

A control input to first beta antenna switching element 138 receives a first bit B1 of the second switching signal SSS. A control input to the second beta antenna switching element 140 receives a second bit B2 of the second switching signal SSS. A control input to the N$^{TH}$ beta antenna switching element 142 receives an N$^{TH}$ bit BN of the second switching signal SSS. Similarly, a control input to the first beta switching element 150 receives the first bit B1 of the second switching signal SSS. A control input to the second beta switching element 152 receives the second bit B2 of the second switching signal SSS. A control input to the N$^{TH}$ beta switching element 154 receives the N$^{TH}$ bit BN of the second switching signal SSS. As such, the control circuitry 60 (FIG. 3) selects any of the beta sub-band bandpass filters 144, 146, 148 by closing or opening appropriate beta switching elements 138, 140, 142, 150, 152, 154 via the second switching signal SSS. Any or all of the beta switching elements 138, 140, 142, 150, 152, 154 may be MEMS switching elements. The second tunable LC bandpass filter 114 receives the second tuning signal STS, such that the control circuitry 60 (FIG. 3) tunes the second tunable LC bandpass filter 114 via the second tuning signal STS.

Figure 9A:
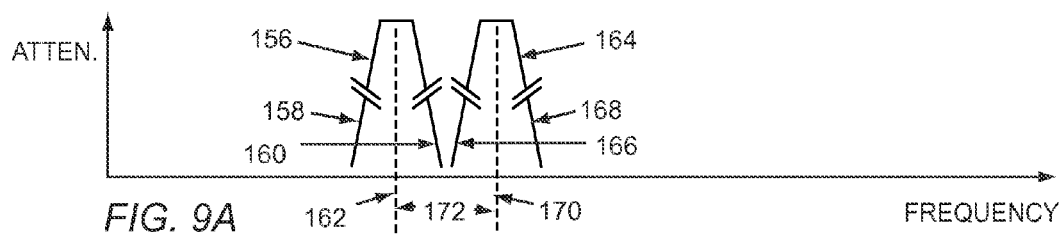
FIG. 9A is a graph showing bandpass filter responses of a first alpha sub-band bandpass filter and a first beta sub-band bandpass filter illustrated in FIGS. 7 and 8, respectively.

FIG. 9A is a graph showing bandpass filter responses of the first alpha sub-band bandpass filter 124 and the first beta sub-band bandpass filter 144 illustrated in FIGS. 7 and 8, respectively. The bandpass filter responses of the first alpha sub-band bandpass filter 124 and the first beta sub-band bandpass filter 144 are exemplary and not intended to limit the scope of the invention. The first alpha sub-band bandpass filter 124, which may be a transmit filter, has a first alpha sub-band 156, a first alpha lower passband edge 158, a first alpha upper passband edge 160, and a first alpha fixed passband center frequency 162, which may be a transmit center frequency. The first beta sub-band bandpass filter 144, which may be a receive filter, has a first beta sub-band 164, a first beta lower passband edge 166, a first beta upper passband edge 168, and a first beta fixed passband center frequency 170. The first alpha sub-band bandpass filter 124 and the first beta sub-band bandpass filter 144 have a first duplex frequency 172, which is a difference between the first alpha fixed passband center frequency 162 and the first beta fixed passband center frequency 170.

When the control circuitry 60 (FIG. 3) selects the first alpha sub-band bandpass filter 124 and the first beta sub-band bandpass filter 144, the control circuitry 60 (FIG. 3) may tune the first tunable LC bandpass filter 104 via the first tuning signal FTS, such that a tunable passband center frequency of the first tunable LC bandpass filter 104 is about equal to the first alpha fixed passband center frequency 162. Further, the control circuitry 60 (FIG. 3) may also tune the second tunable LC bandpass filter 114 via the second tuning signal STS, such that a tunable passband center frequency of the second tunable LC bandpass filter 114 is about equal to the first beta fixed passband center frequency 170.

Figure 9B:
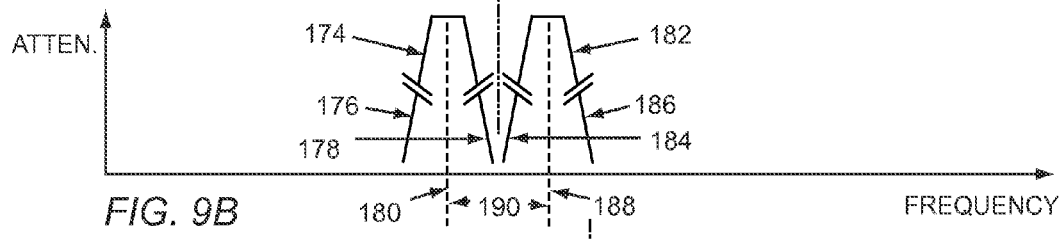
FIG. 9B is a graph showing bandpass filter responses of a second alpha sub-band bandpass filter and a second beta sub-band bandpass filter illustrated in FIGS. 7 and 8, respectively.

FIG. 9B is a graph showing bandpass filter responses of the second alpha sub-band bandpass filter 126 and the second beta sub-band bandpass filter 146 illustrated in FIGS. 7 and 8, respectively. The bandpass filter responses of the second alpha sub-band bandpass filter 126 and the second beta sub-band bandpass filter 146 are exemplary and not intended to limit the scope of the invention. The second alpha sub-band bandpass filter 126, which may be a transmit filter, has a second alpha sub-band 174, a second alpha lower passband edge 176, a second alpha upper passband edge 178, and a second alpha fixed passband center frequency 180, which may be a transmit center frequency. The second beta sub-band bandpass filter 146, which may be a receive filter, has a second beta sub-band 182, a second beta lower passband edge 184, a second beta upper passband edge 186, and a second beta fixed passband center frequency 188. The second alpha sub-band bandpass filter 126 and the second beta sub-band bandpass filter 146 have a second duplex frequency 190, which is a difference between the second alpha fixed passband center frequency 180 and the second beta fixed passband center frequency 188.

When the control circuitry 60 (FIG. 3) selects the second alpha sub-band bandpass filter 126 and the second beta sub-band bandpass filter 146, the control circuitry 60 (FIG. 3) may tune the first tunable LC bandpass filter 104 via the first tuning signal FTS, such that a tunable passband center frequency of the first tunable LC bandpass filter 104 is about equal to the second alpha fixed passband center frequency 180. Further, the control circuitry 60 (FIG. 3) may also tune the second tunable LC bandpass filter 114 via the second tuning signal STS, such that a tunable passband center frequency of the second tunable LC bandpass filter 114 is about equal to the second beta fixed passband center frequency 188.

Figure 9C:
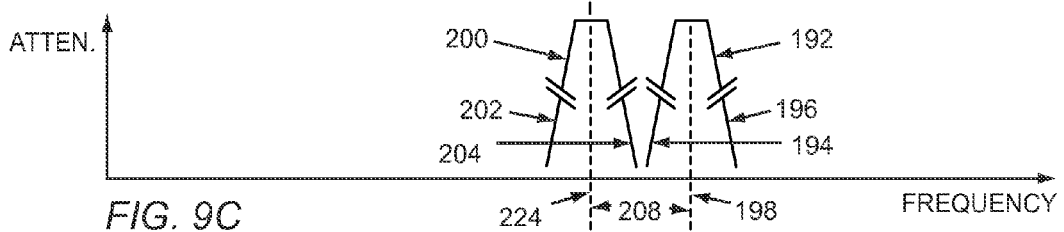
FIG. 9C is a graph showing bandpass filter responses of a third alpha sub-band bandpass filter (not shown) and a third beta sub-band bandpass filter (not shown).

FIG. 9C is a graph showing bandpass filter responses of a third alpha sub-band bandpass filter (not shown) and a third beta sub-band bandpass filter (not shown). The bandpass filter responses of the third alpha sub-band bandpass filter and the third beta sub-band bandpass filter are exemplary and not intended to limit the scope of the invention. The third alpha sub-band bandpass filter, which may be a transmit filter, has a third alpha sub-band 192, a third alpha lower passband edge 194, a third alpha upper passband edge 196, and a third alpha fixed passband center frequency 198, which may be a transmit center frequency. The third beta sub-band bandpass filter, which may be a receive filter, has a third beta sub-band 200, a third beta lower passband edge 202, a third beta upper passband edge 204, and a third beta fixed passband center frequency 206. The third alpha sub-band bandpass filter and the third beta sub-band bandpass filter have a third duplex frequency 208, which is a difference between the third alpha fixed passband center frequency 198 and the third beta fixed passband center frequency 206.

When the control circuitry 60 (FIG. 3) selects the third alpha sub-band bandpass filter and the third beta sub-band bandpass filter, the control circuitry 60 (FIG. 3) may tune the first tunable LC bandpass filter 104 via the first tuning signal FTS, such that a tunable passband center frequency of the first tunable LC bandpass filter 104 is about equal to the third alpha fixed passband center frequency 198. Further, the control circuitry 60 (FIG. 3) may also tune the second tunable LC bandpass filter 114 via the second tuning signal STS, such that a tunable passband center frequency of the second tunable LC bandpass filter 114 is about equal to the third beta fixed passband center frequency 206.

Figure 9D:
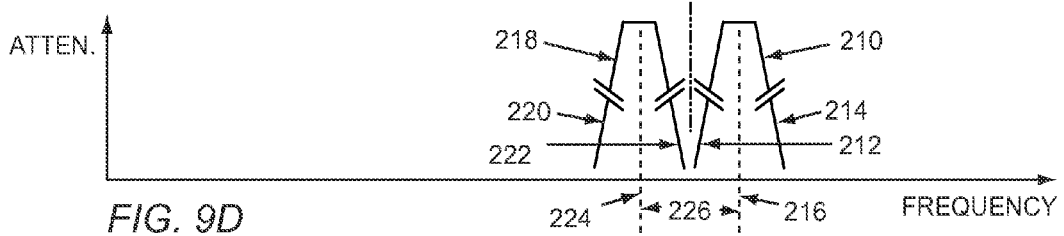
FIG. 9D is a graph showing bandpass filter responses of an $N^{TH}$ alpha sub-band bandpass filter and an $N^{TH}$ beta sub-band bandpass filter illustrated in FIGS. 7 and 8, respectively.

FIG. 9D is a graph showing bandpass filter responses of the $N^{TH}$ alpha sub-band bandpass filter 128 and the $N^{TH}$ beta sub-band bandpass filter 148 illustrated in FIGS. 7 and 8, respectively. The bandpass filter responses of the $N^{TH}$ alpha sub-band bandpass filter 128 and the $N^{TH}$ beta sub-band bandpass filter 148 are exemplary and not intended to limit the scope of the invention. The third alpha sub-band bandpass filter 128, which may be a transmit filter, has an $N^{TH}$ alpha sub-band 210, an $N^{TH}$ alpha lower passband edge 212, an $N^{TH}$ alpha upper passband edge 214, and an $N^{TH}$ alpha fixed passband center frequency 216, which may be a transmit center frequency. The $N^{TH}$ beta sub-band bandpass filter 148, which may be a receive filter, has an $N^{TH}$ beta sub-band 218, an $N^{TH}$ beta lower passband edge 220, an $N^{TH}$ beta upper passband edge 222, and an $N^{TH}$ beta fixed passband center frequency 224. The $N^{TH}$ alpha sub-band bandpass filter 128 and the $N^{TH}$ beta sub-band bandpass filter 148 have an $N^{TH}$ duplex frequency 226, which is a difference between the $N^{TH}$ alpha fixed passband center frequency 216 and the $N^{TH}$ beta fixed passband center frequency 224.

When the control circuitry 60 (FIG. 3) selects the $N^{TH}$ alpha sub-band bandpass filter 128 and the $N^{TH}$ beta sub-band bandpass filter 148, the control circuitry 60 (FIG. 3) may tune the first tunable LC bandpass filter 104 via the first tuning signal FTS, such that a tunable passband center frequency of the first tunable LC bandpass filter 104 is about equal to the $N^{TH}$ alpha fixed passband center frequency 216. Further, the control circuitry 60 (FIG. 3) may also tune the second tunable LC bandpass filter 114 via the second tuning signal STS, such that a tunable passband center frequency of the second tunable LC bandpass filter 114 is about equal to the $N^{TH}$ beta fixed passband center frequency 224.

In an exemplary embodiment of the alpha sub-band bandpass filters 124, 126, 128 and the beta sub-band band pass filters 144, 146, 148, each of the alpha sub-band bandpass filters 124, 126, 128 is associated with a corresponding each of the alpha sub-bands 156, 174, 192, 210, which are transmitter sub-bands, and each of the beta sub-band bandpass filters 144, 146, 148 is associated with a corresponding each of the beta sub-bands 164, 182, 200, 218, which are receiver sub-bands. As such, the alpha fixed passband center frequencies 162, 180, 198, 216 are transmitter center frequencies and the beta fixed passband center frequencies 170, 188, 206, 224 are receiver center frequencies. The first and second alpha fixed passband center frequencies 162, 180 are less than the first and second beta fixed passband center frequencies 170, 188, and the third and $N^{TH}$ alpha fixed passband center frequencies 198, 216 are greater than the third and $N^{TH}$ beta fixed passband center frequencies 206, 224.

In an exemplary embodiment of the alpha sub-band bandpass filters 124, 126, 128 and the beta sub-band band pass filters 144, 146, 148, each of the duplex frequencies 172, 190, 208, 226 are about equal to one another. Some protocols, such as wideband code division multiple access (WCDMA) may require that duplex frequencies be equal to one another.

Figure 10:
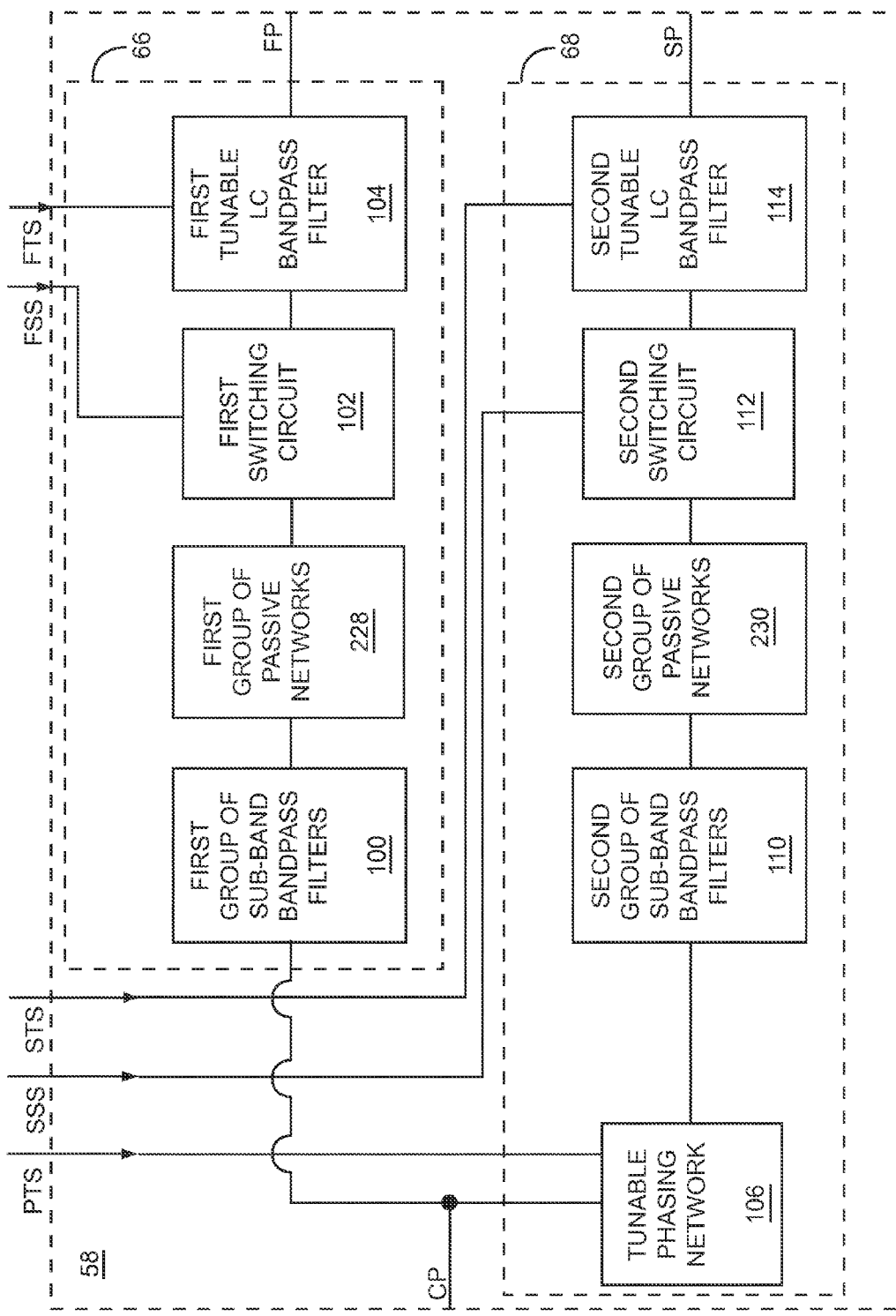
FIG. 10 shows details of a first bandpass filter and a second bandpass filter illustrated in FIG. 4 according to an alternate embodiment of the first bandpass filter and the second bandpass filter.

FIG. 10 shows details of the first bandpass filter 66 and the second bandpass filter 68 illustrated in FIG. 4 according to an alternate embodiment of the first bandpass filter 66 and the second bandpass filter 68. The first bandpass filter 66 and the second bandpass filter 68 illustrated in FIG. 10 are similar to the first bandpass filter 66 and the second bandpass filter 68 illustrated in FIG. 6, except in the first bandpass filter 66 and the second bandpass filter 68 illustrated in FIG. 10, the first antenna switching circuit 98 and the second antenna switching circuit 108 have been omitted, such that the first group of sub-band bandpass filters 100 is directly coupled to the common port CP and the second group of sub-band bandpass filters 110 is directly coupled to the tunable phasing network 106. Further, the first bandpass filter 66 includes a first group of passive networks 228 coupled between the first group of sub-band bandpass filters 100 and the first switching circuit 102, and the second bandpass filter 68 includes a second group of passive networks 230 coupled between the second group of sub-band bandpass filters 110 and the second switching circuit 112. In another embodiment of the first bandpass filter 66 and the second bandpass filter 68, the first bandpass filter 66 further includes the first antenna switching circuit 98 coupled between the common port CP and the first group of sub-band bandpass filters 100, and the second bandpass filter 68 further includes the second antenna switching circuit 108 coupled between the tunable phasing network 106 and the second group of sub-band bandpass filters 110.

Figure 11:
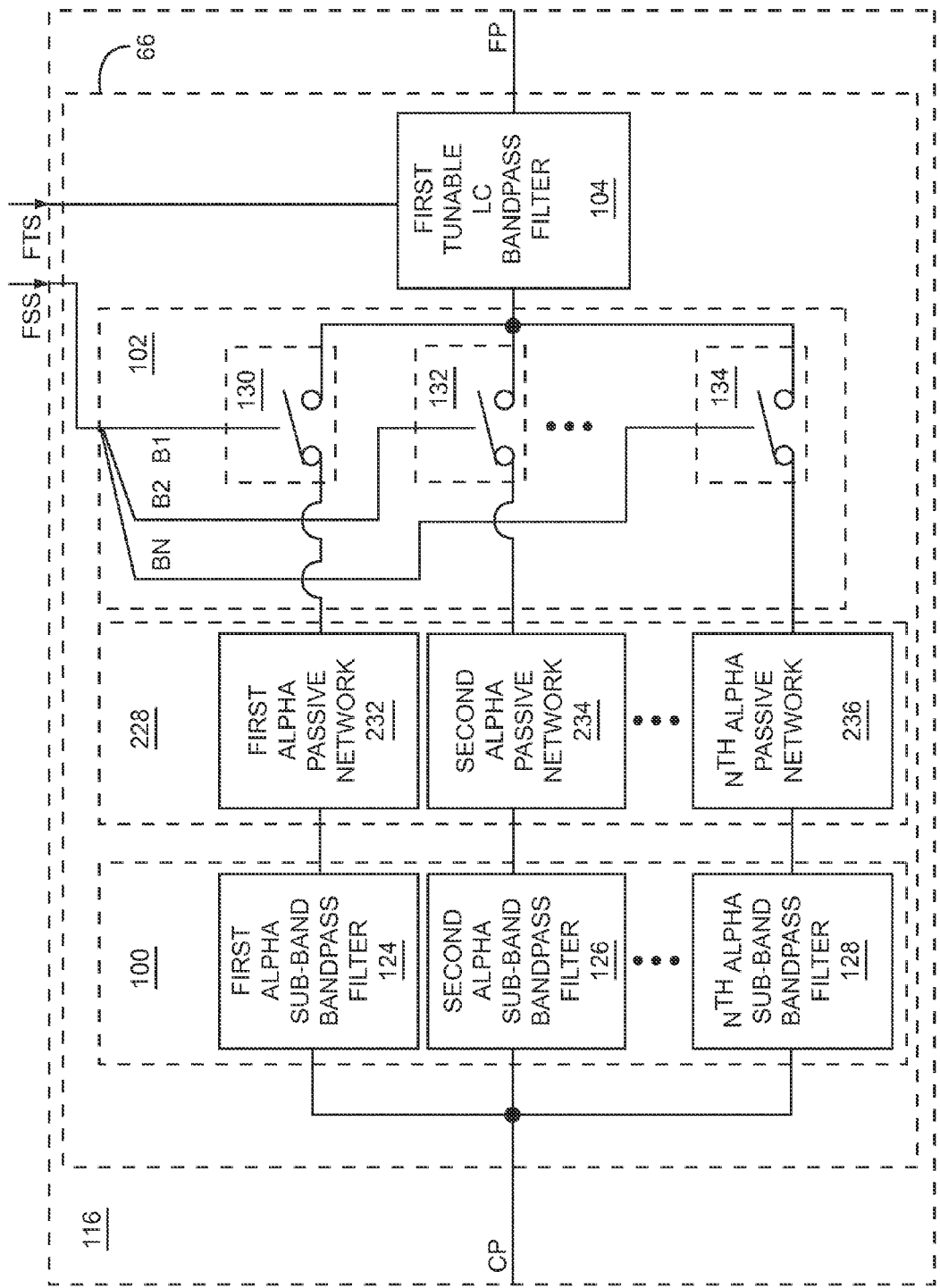
FIG. 11 shows details of the first bandpass filter illustrated in FIG. 10 according to one embodiment of the first bandpass filter.

FIG. 11 shows details of the first bandpass filter 66 illustrated in FIG. 10 according to one embodiment of the first bandpass filter 66. The first group of sub-band bandpass filters 100 includes the first alpha sub-band bandpass filter 124, the second alpha sub-band bandpass filter 126, and up to and including the $N^{TH}$ alpha sub-band bandpass filter 128. The first group of passive networks 228 includes a first alpha passive network 232, a second alpha passive network 234, and up to and including an $N^{TH}$ alpha passive network 236. The first switching circuit 102 includes the first alpha switching element 130, the second alpha switching element 132, and up to and including the $N^{TH}$ alpha switching element 134.

The first alpha sub-band bandpass filter 124 is coupled between the common port CP and the first alpha passive network 232. The first alpha switching element 130 is coupled between the first alpha passive network 232 and the first tunable LC bandpass filter 104. The second alpha sub-band bandpass filter 126 is coupled between the common port CP and the second alpha passive network 234. The second alpha switching element 132 is coupled between the second alpha passive network 234 and the first tunable LC bandpass filter 104. The $N^{TH}$ alpha sub-band bandpass filter 128 is coupled between the common port CP and the $N^{TH}$ alpha passive network 236. The $N^{TH}$ alpha switching element 134 is coupled between the $N^{TH}$ alpha passive network 236 and the first tunable LC bandpass filter 104.

When the first alpha sub-band bandpass filter 124 is selected by the control circuitry 60 (FIG. 3), the first alpha switching element 130 is CLOSED, such that the first alpha sub-band bandpass filter 124 is electrically coupled between the common port CP and the first tunable LC bandpass filter 104 through the first alpha passive network 232. Normally, all of the alpha switching elements 132, 134 other than the first alpha switching element 130 are OPEN, such that all of the alpha sub-band bandpass filters 126, 128 other than the first alpha sub-band bandpass filter 124 are isolated from the common port CP and from the first tunable LC bandpass filter 104, respectively.

Similarly, when the second alpha sub-band bandpass filter 126 is selected by the control circuitry 60 (FIG. 3), the second alpha switching element 132 is CLOSED, such that the second alpha sub-band bandpass filter 126 is electrically coupled between the common port CP and the first tunable LC bandpass filter 104 through the second alpha passive network 234. Normally, all of the alpha switching elements 130, 134 other than the second alpha switching element 132 are OPEN, such that all of the alpha sub-band bandpass filters 124, 128 other than the second alpha sub-band bandpass filter 126 are isolated from the common port CP and from the first tunable LC bandpass filter 104, respectively.

Similarly, when the $N^{TH}$ alpha sub-band bandpass filter 128 is selected by the control circuitry 60 (FIG. 3), the $N^{TH}$ alpha switching element 134 is CLOSED, such that the $N^{TH}$ alpha sub-band bandpass filter 128 is electrically coupled between the common port CP and the first tunable LC bandpass filter 104 through the $N^{TH}$ alpha passive network 236. Normally, all of the alpha switching elements 130, 132 other than the $N^{TH}$ alpha switching element 134 are OPEN, such that all of the alpha sub-band bandpass filters 124, 126 other than the $N^{TH}$ alpha sub-band bandpass filter 128 are isolated from the common port CP and from the first tunable LC bandpass filter 104, respectively.

The control input to the first alpha switching element 130 receives the first bit B1 of the first switching signal FSS. The control input to the second alpha switching element 132 receives the second bit B2 of the first switching signal FSS. The control input to the $N^{TH}$ alpha switching element 134 receives the $N^{TH}$ bit BN of the first switching signal FSS. As such, the control circuitry 60 (FIG. 3) selects any of the alpha sub-band bandpass filters 124, 126, 128 by closing or opening appropriate alpha switching elements 130, 132, 134 via the first switching signal FSS. Any or all of the alpha switching elements 130, 132, 134 may be micro-electro-mechanicalsystems (MEMS) switching elements. The first tunable LC bandpass filter 104 receives the first tuning signal FTS, such that the control circuitry 60 (FIG. 3) tunes the first tunable LC bandpass filter 104 via the first tuning signal FTS.

Figure 12:
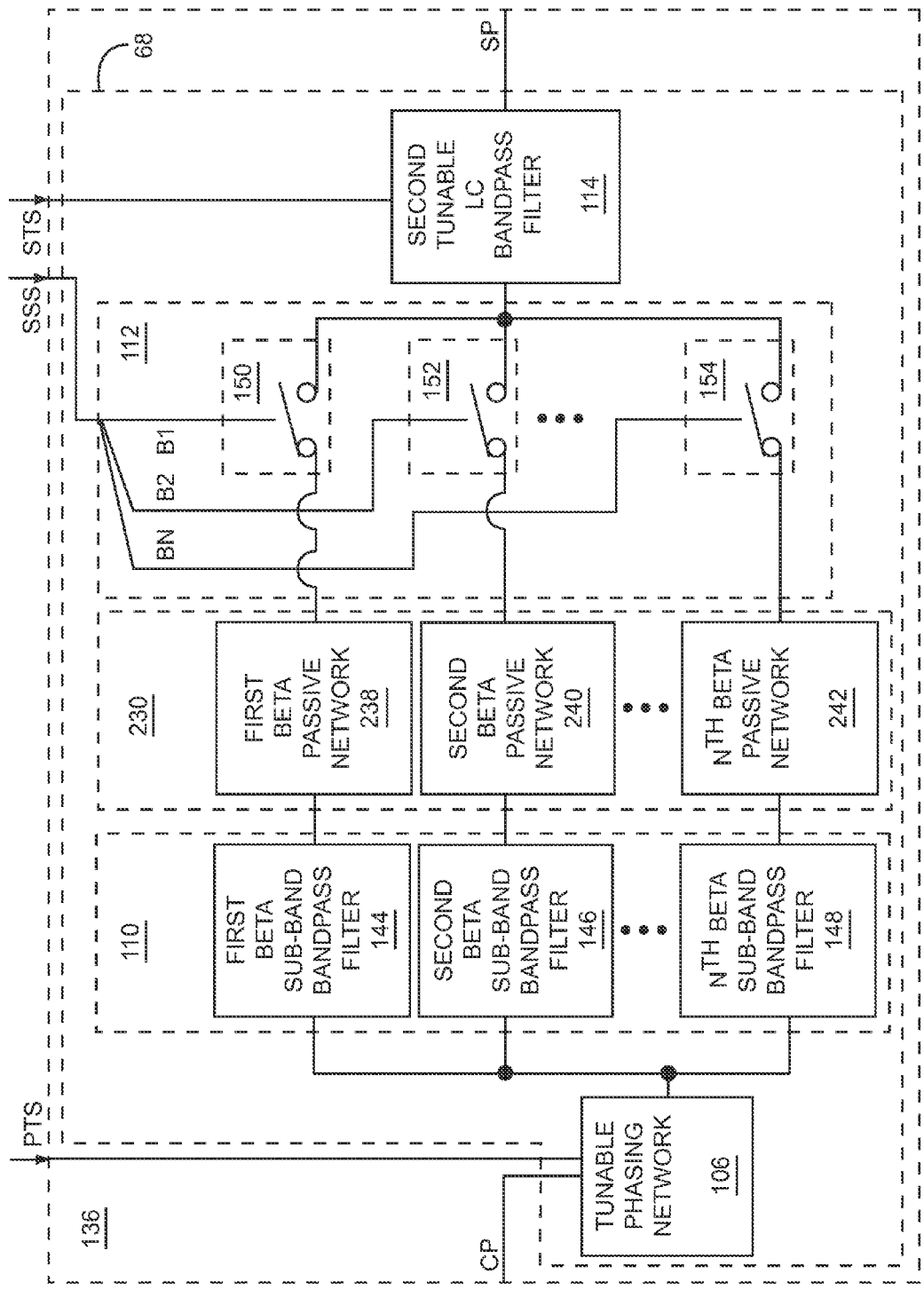
FIG. 12 shows details of the second bandpass filter illustrated in FIG. 10 according to one embodiment of the second bandpass filter.

FIG. 12 shows details of the second bandpass filter 68 illustrated in FIG. 10 according to one embodiment of the second bandpass filter 68. The second group of sub-band bandpass filters 110 includes the first beta sub-band bandpass filter 144, the second beta sub-band bandpass filter 146, and up to and including the $N^{TH}$ beta sub-band bandpass filter 148. The second group of passive networks 230 includes a first beta passive network 238, a second beta passive network 240, and up to and including an $N^{TH}$ beta passive network 242. The second switching circuit 112 includes the first beta switching element 150, the second beta switching element 152, and up to and including the $N^{TH}$ beta switching element 154.

The first beta sub-band bandpass filter 144 is coupled between the tunable phasing network 106 and the first beta passive network 238. The first beta switching element 150 is coupled between the first beta passive network 238 and the second tunable LC bandpass filter 114. The second beta sub-band bandpass filter 146 is coupled between the tunable phasing network 106 and the second beta passive network 240. The second beta switching element 152 is coupled between the second beta passive network 240 and the second tunable LC bandpass filter 114. The $N^{TH}$ beta sub-band bandpass filter 148 is coupled between the tunable phasing network 106 and the $N^{TH}$ beta passive network 242. The $N^{TH}$ beta switching element 154 is coupled between the $N^{TH}$ beta passive network 242 and the second tunable LC bandpass filter 114.

When the first beta sub-band bandpass filter 144 is selected by the control circuitry 60 (FIG. 3), the first beta switching element 150 is CLOSED, such that the first beta sub-band bandpass filter 144 is electrically coupled between the common port CP and the second tunable LC bandpass filter 114 through the tunable phasing network 106 and the first beta passive network 238. Normally, all of the beta switching elements 152, 154 other than the first beta switching element 150 are OPEN, such that all of the beta sub-band bandpass filters 146, 148 other than the first beta sub-band bandpass filter 144 are isolated from the common port CP and from the second tunable LC bandpass filter 114, respectively.

Similarly, when the second beta sub-band bandpass filter 146 is selected by the control circuitry 60 (FIG. 3), the second beta switching element 152 is CLOSED, such that the second beta sub-band bandpass filter 146 is electrically coupled between the common port CP and the second tunable LC bandpass filter 114 through the tunable phasing network 106 and the second beta passive network 240. Normally, all of the beta switching elements 150, 154 other than the second beta switching element 152 are OPEN, such that all of the beta sub-band bandpass filters 144, 148 other than the second beta sub-band bandpass filter 146 are isolated from the common port CP and from the second tunable LC bandpass filter 114, respectively.

Similarly, when the $N^{TH}$ beta sub-band bandpass filter 148 is selected by the control circuitry 60 (FIG. 3), the $N^{TH}$ beta switching element 154 is CLOSED, such that the $N^{TH}$ beta sub-band bandpass filter 148 is electrically coupled between the common port CP and the second tunable LC bandpass filter 114 through the tunable phasing network 106 and the $N^{TH}$ beta passive network 242. Normally, all of the beta switching elements 150, 152 other than the $N^{TH}$ beta switching element 154 are OPEN, such that all of the beta sub-band bandpass filters 144, 146 other than the $N^{TH}$ beta sub-band bandpass filter 148 are isolated from the common port CP and from the second tunable LC bandpass filter 114, respectively.

A control input to the first beta switching element 150 receives the first bit B1 of the second switching signal SSS. A control input to the second beta switching element 152 receives the second bit B2 of the second switching signal SSS. A control input to the $N^{TH}$ beta switching element 154 receives the $N^{TH}$ bit BN of the second switching signal SSS. As such, the control circuitry 60 (FIG. 3) selects any of the beta sub-band bandpass filters 144, 146, 148 by closing or opening appropriate beta switching elements 150, 152, 154 via the second switching signal SSS. Any or all of the beta switching elements 150, 152, 154 may be MEMS switching elements. The second tunable LC bandpass filter 114 receives the second tuning signal STS, such that the control circuitry 60 (FIG. 3) tunes the second tunable LC bandpass filter 114 via the second tuning signal STS.

Figure 13:
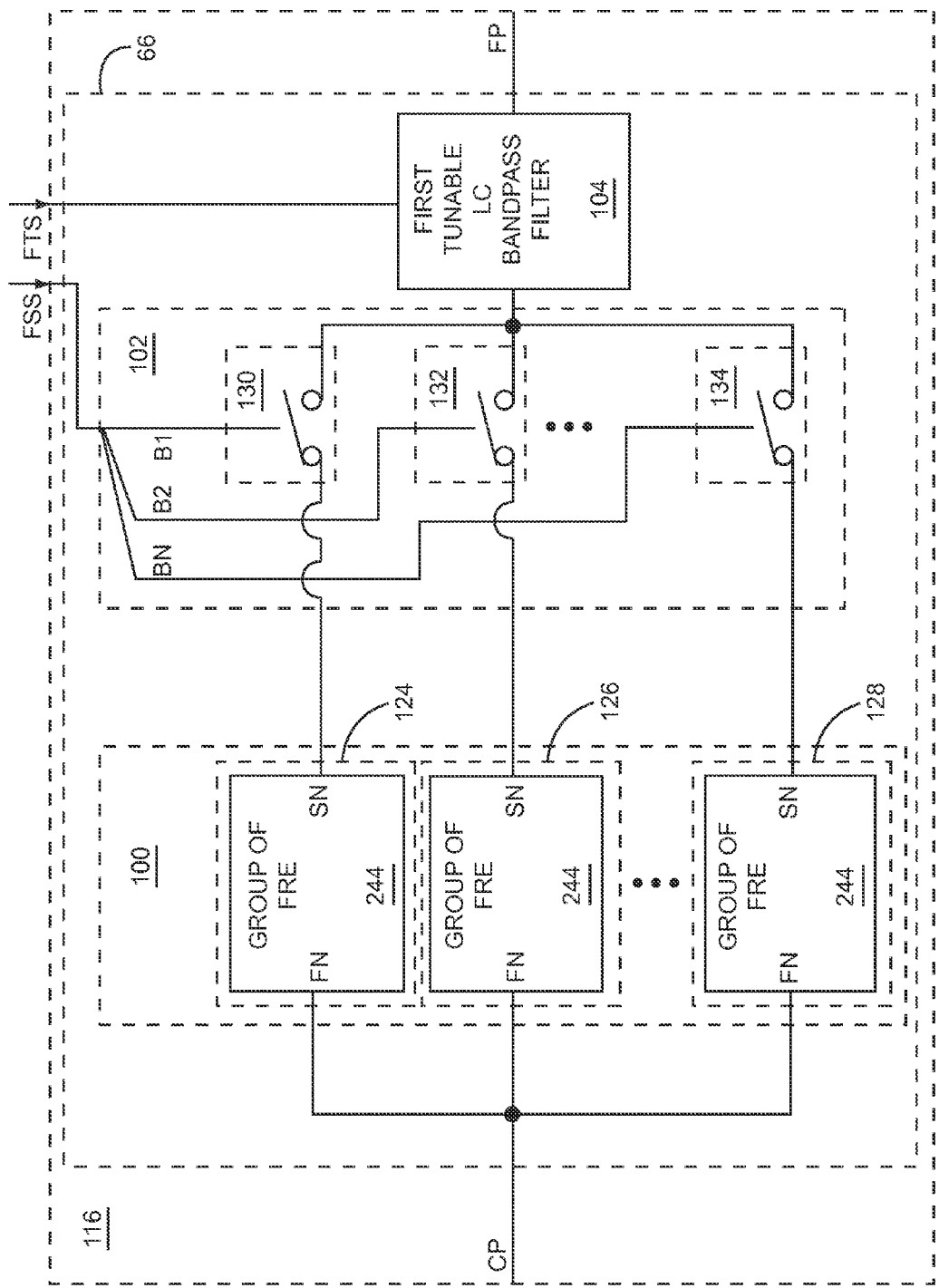
FIG. 13 shows details of the first bandpass filter illustrated in FIG. 10 according to an alternate embodiment of the first bandpass filter.

FIG. 13 shows details of the first bandpass filter 66 illustrated in FIG. 10 according to an alternate embodiment of the first bandpass filter 66. The first bandpass filter 66 illustrated in FIG. 13 is similar to the first bandpass filter 66 illustrated in FIG. 11, except in the first bandpass filter 66 illustrated in FIG. 13, the first group of passive networks 228 has been omitted, such that the first alpha sub-band bandpass filter 124 is directly coupled to the first alpha switching element 130, the second alpha sub-band bandpass filter 126 is directly coupled to the second alpha switching element 132, and the $N^{TH}$ alpha sub-band bandpass filter 128 is directly coupled to the $NT^{TH}$ alpha switching element 134.

Further, the first alpha sub-band bandpass filter 124 includes a group of fixed resonating elements 244 having a first node FN and a second node SN, the second alpha sub-band bandpass filter 126 includes a group of fixed resonating elements 244 having a first node FN and a second node SN, and the $N^{TH}$ alpha sub-band bandpass filter 128 includes a group of fixed resonating elements 244 having a first node FN and a second node SN. In one embodiment of the first group of sub-band bandpass filters 100, the group of fixed resonating elements 244 of the first alpha sub-band bandpass filter 124 includes multiple SAW resonating elements, the group of fixed resonating elements 244 of the second alpha sub-band bandpass filter 126 includes multiple SAW resonating elements, and the group of fixed resonating elements 244 of the $N^{TH}$ alpha sub-band bandpass filter 128 includes multiple SAW resonating elements.

In an alternate embodiment of the first group of sub-band bandpass filters 100, the group of fixed resonating elements 244 of the first alpha sub-band bandpass filter 124 includes multiple bulk acoustic wave (BAW) resonating elements, the group of fixed resonating elements 244 of the second alpha sub-band bandpass filter 126 includes multiple BAW resonating elements, and the group of fixed resonating elements 244 of the $N^{TH}$ alpha sub-band bandpass filter 128 includes multiple BAW resonating elements.

In an additional embodiment of the first group of sub-band bandpass filters 100, the group of fixed resonating elements 244 of the first alpha sub-band bandpass filter 124 includes multiple tank circuits, the group of fixed resonating elements 244 of the second alpha sub-band bandpass filter 126 includes multiple tank circuits, and the group of fixed resonating elements 244 of the $N^{TH}$ alpha sub-band bandpass filter 128 includes multiple tank circuits.

In one embodiment of the first group of sub-band bandpass filters 100, the group of fixed resonating elements 244 of the first alpha sub-band bandpass filter 124 does not include tank circuits, the group of fixed resonating elements 244 of the second alpha sub-band bandpass filter 126 does not include any tank circuits, and the group of fixed resonating elements 244 of the $N^{TH}$ alpha sub-band bandpass filter 128 does not include and tank circuits.

Figure 14:
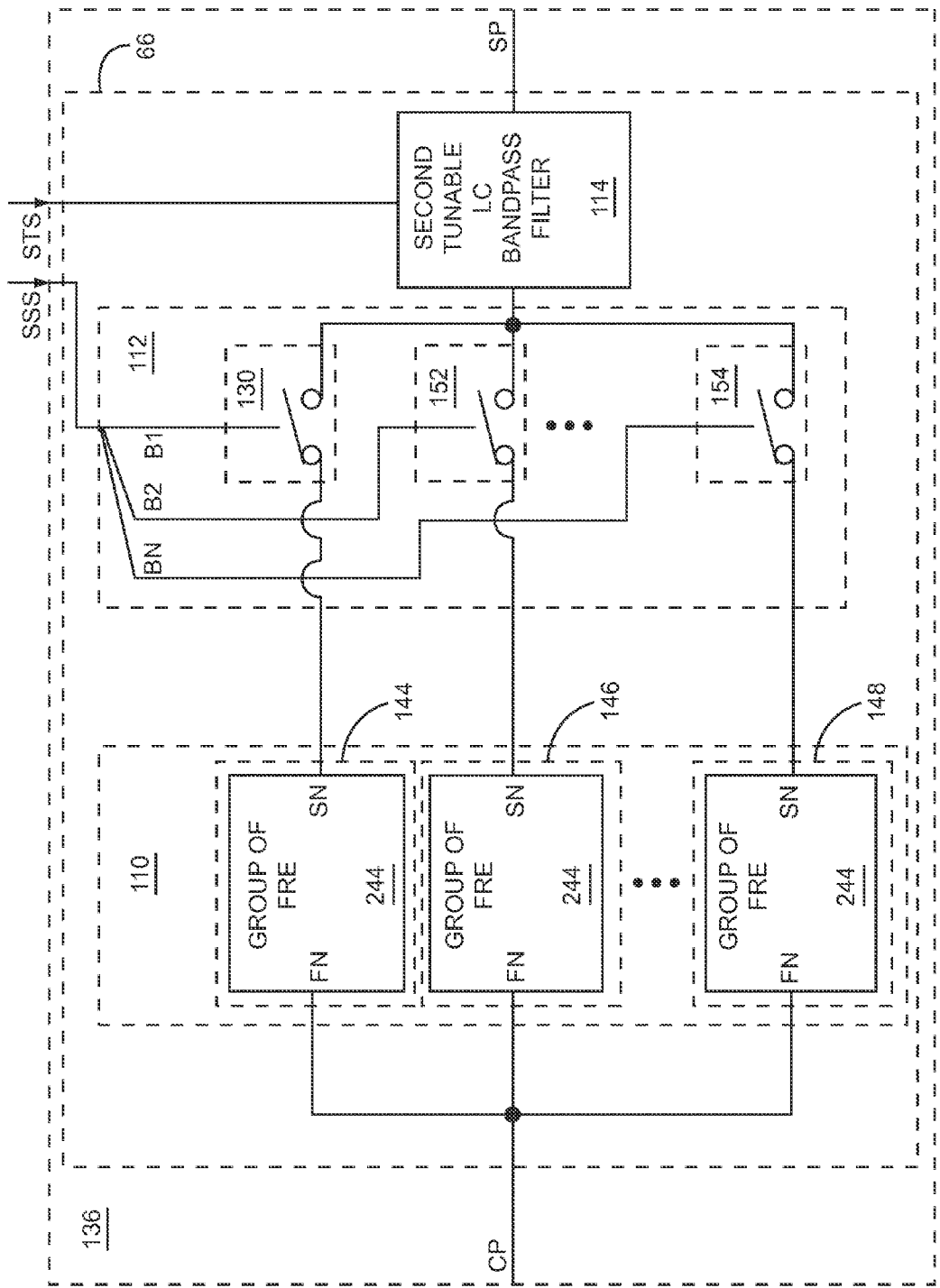
FIG. 14 shows details of the second bandpass filter illustrated in FIG. 10 according to an alternate embodiment of the second bandpass filter.

FIG. 14 shows details of the second bandpass filter 68 illustrated in FIG. 10 according to an alternate embodiment of the second bandpass filter 68. The second bandpass filter 68 illustrated in FIG. 14 is similar to the second bandpass filter 68 illustrated in FIG. 12, except in the second bandpass filter 68 illustrated in FIG. 14, the second group of passive networks 230 has been omitted and the tunable phasing network 106 has been omitted, such that the first beta sub-band bandpass filter 144 is directly coupled between the first beta switching element 150 and the common port CP, the second beta sub-band bandpass filter 146 is directly coupled between the second beta switching element 152 and the common port CP, and the $N^{TH}$ beta sub-band bandpass filter 148 is directly coupled between the $N^{TH}$ beta switching element 154 and the common port CP.

Further, the first beta sub-band bandpass filter 144 includes a group of fixed resonating elements 244 having a first node FN and a second node SN, the second beta sub-band bandpass filter 146 includes a group of fixed resonating elements 244 having a first node FN and a second node SN, and the $N^{TH}$ beta sub-band bandpass filter 148 includes a group of fixed resonating elements 244 having a first node FN and a second node SN. In one embodiment of the second group of sub-band bandpass filters 110, the group of fixed resonating elements 244 of the first beta sub-band bandpass filter 144 includes multiple SAW resonating elements, the group of fixed resonating elements 244 of the second beta sub-band bandpass filter 146 includes multiple SAW resonating elements, and the group of fixed resonating elements 244 of the $N^{TH}$ beta sub-band bandpass filter 148 includes multiple SAW resonating elements.

In an alternate embodiment of the second group of sub-band bandpass filters 110, the group of fixed resonating elements 244 of the first beta sub-band bandpass filter 144 includes multiple BAW resonating elements, the group of fixed resonating elements 244 of the second beta sub-band bandpass filter 146 includes multiple BAW resonating elements, and the group of fixed resonating elements 244 of the $N^{TH}$ beta sub-band bandpass filter 148 includes multiple BAW resonating elements.

In an additional embodiment of the second group of sub-band bandpass filters 110, the group of fixed resonating elements 244 of the first beta sub-band bandpass filter 144 includes multiple tank circuits, the group of fixed resonating elements 244 of the second beta sub-band bandpass filter 146 includes multiple tank circuits, and the group of fixed resonating elements 244 of the $N^{TH}$ beta sub-band bandpass filter 148 includes multiple tank circuits.

In one embodiment of the second group of sub-band bandpass filters 110, the group of fixed resonating elements 244 of the first beta sub-band bandpass filter 144 does not include tank circuits, the group of fixed resonating elements 244 of the second beta sub-band bandpass filter 146 does not include any tank circuits, and the group of fixed resonating elements 244 of the $N^{TH}$ beta sub-band bandpass filter 148 does not include any tank circuits.

Figure 15:
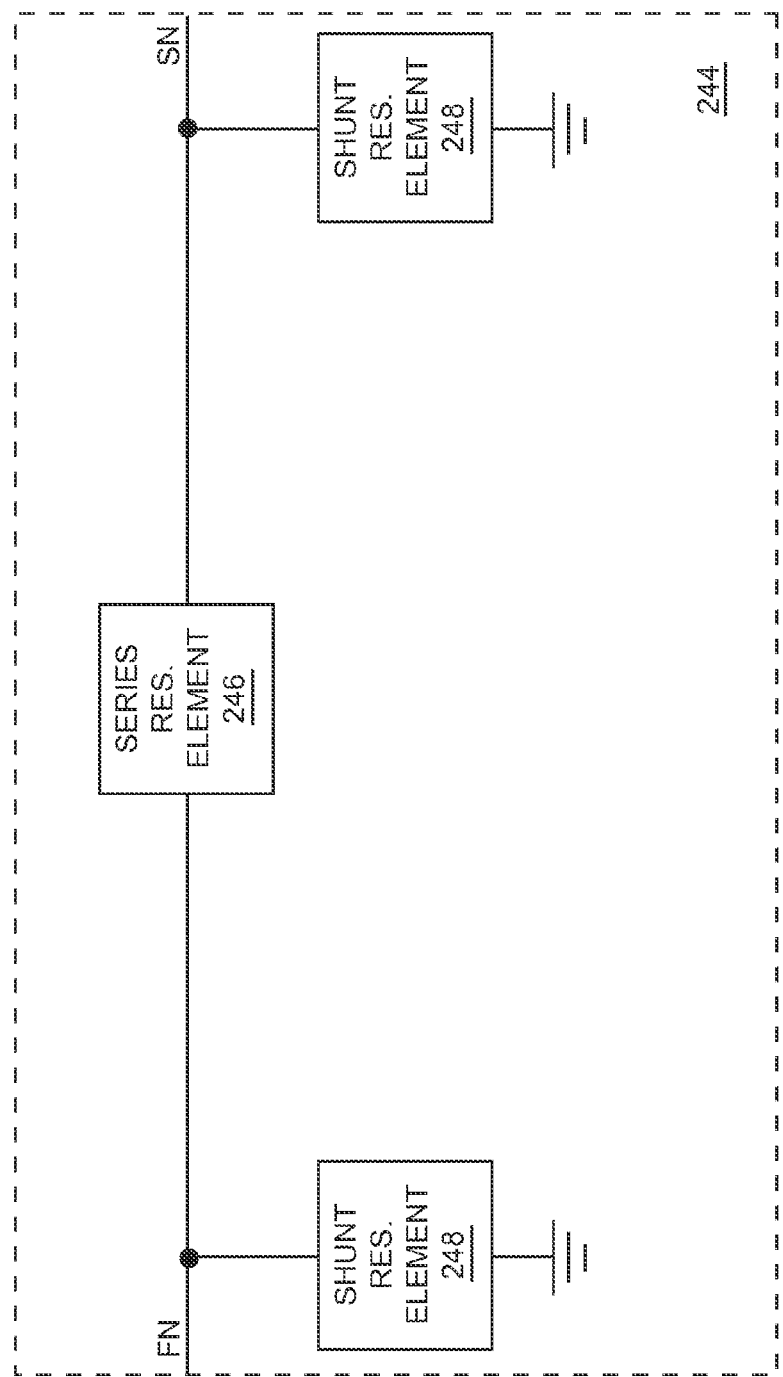
FIG. 15 shows details of a group of fixed resonating elements illustrated in FIGS. 13 and 14 according to one embodiment of the group of fixed resonating elements.

FIG. 15 shows details of the group of fixed resonating elements 244 illustrated in FIGS. 13 and 14 according to one embodiment of the group of fixed resonating elements 244. The group of fixed resonating elements 244 includes a series resonating element 246 coupled directly between the first node FN and the second node SN, a shunt resonating element 248 coupled between the first node FN and ground, and another shunt resonating element 248 coupled between the second node SN and ground.

Figure 16:
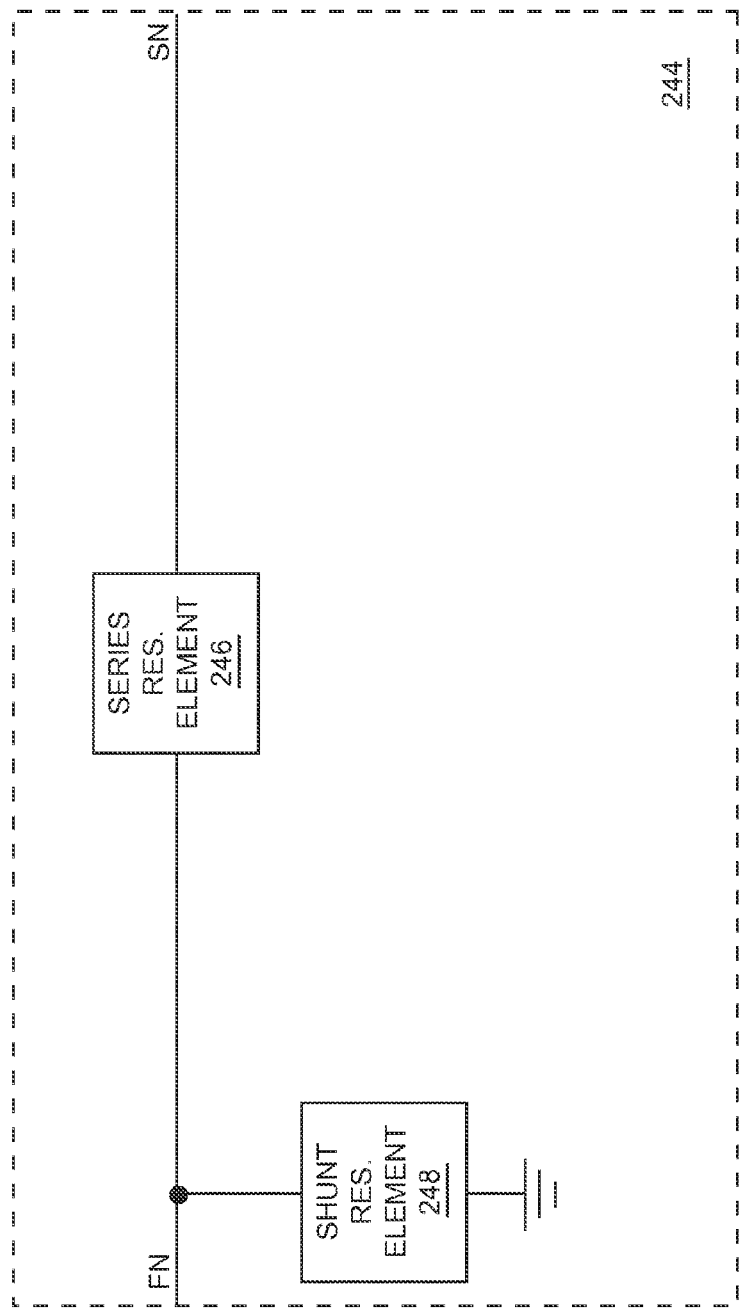
FIG. 16 shows details of the group of fixed resonating elements illustrated in FIGS. 13 and 14 according to an alternate embodiment of the group of fixed resonating elements.

FIG. 16 shows details of the group of fixed resonating elements 244 illustrated in FIGS. 13 and 14 according to an alternate embodiment of the group of fixed resonating elements 244. The group of fixed resonating elements 244 illustrated in FIG. 16 is similar to the group of fixed resonating elements 244 illustrated in FIG. 15, except in the group of fixed resonating elements 244 illustrated in FIG. 16, the shunt resonating element 248 coupled between the second node SN and ground has been omitted.

Figure 17:
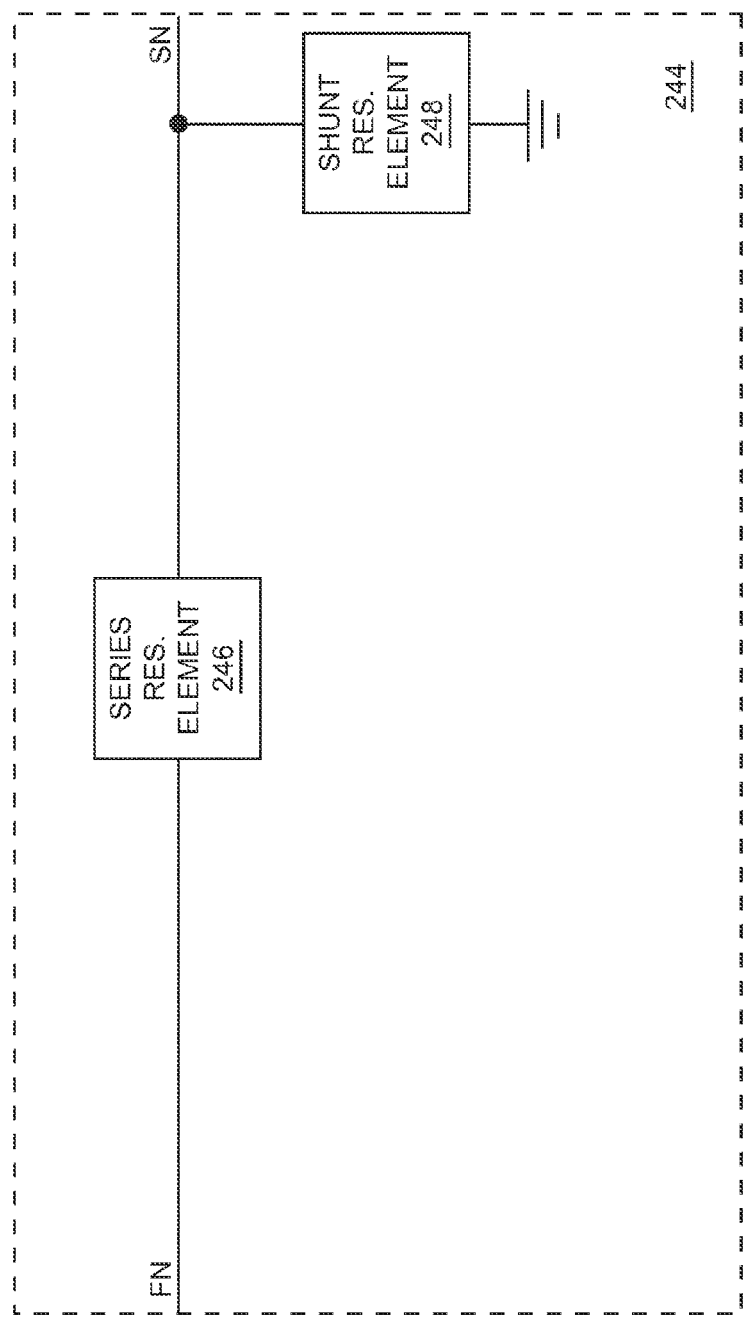
FIG. 17 shows details of the group of fixed resonating elements illustrated in FIGS. 13 and 14 according to an additional embodiment of the group of fixed resonating elements.

FIG. 17 shows details of the group of fixed resonating elements 244 illustrated in FIGS. 13 and 14 according to an additional embodiment of the group of fixed resonating elements 244. The group of fixed resonating elements 244 illustrated in FIG. 17 is similar to the group of fixed resonating elements 244 illustrated in FIG. 15, except in the group of fixed resonating elements 244 illustrated in FIG. 17, the shunt resonating element 248 coupled between the first node FN and ground has been omitted.

Figure 18:
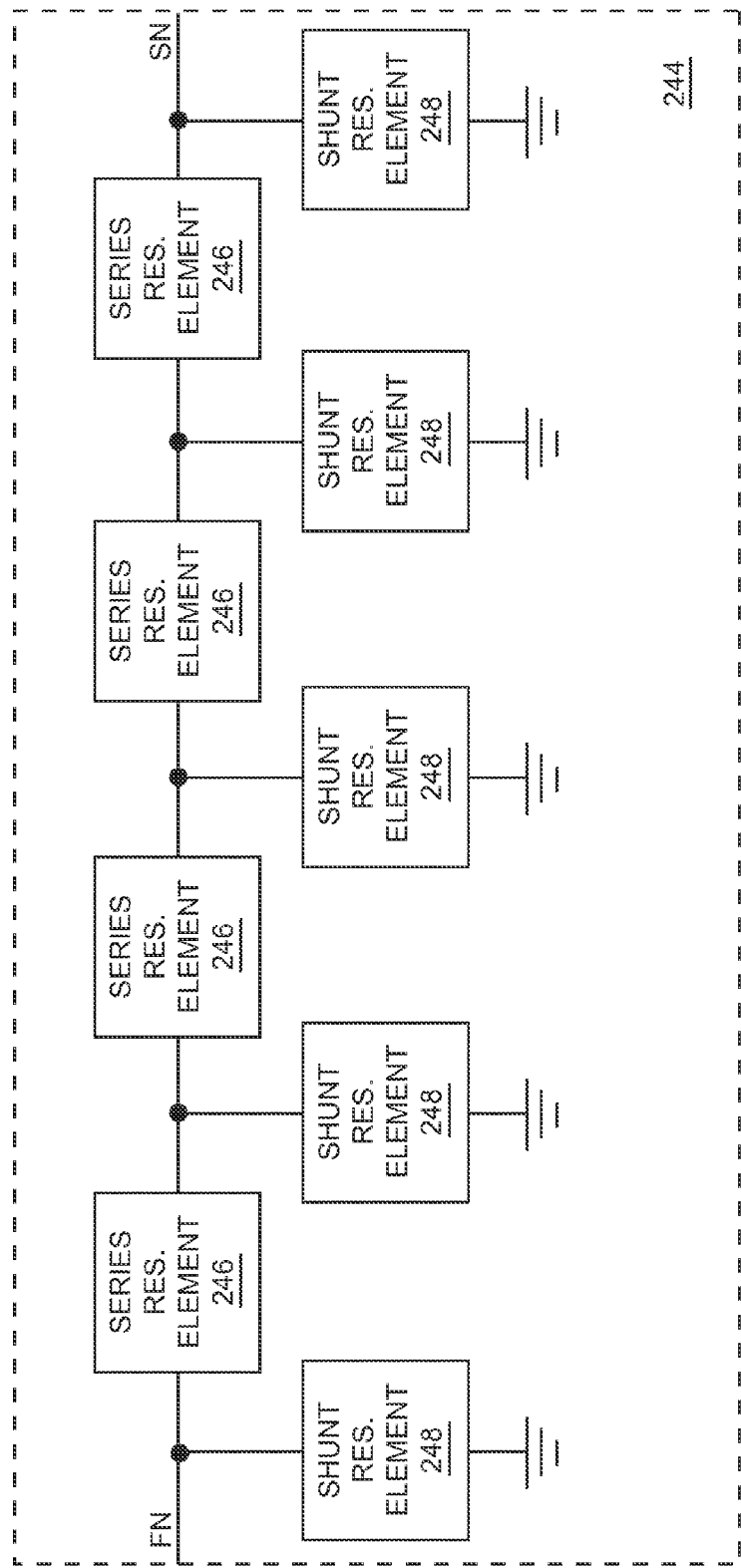
FIG. 18 shows details of the group of fixed resonating elements illustrated in FIGS. 13 and 14 according to another embodiment of the group of fixed resonating elements.

FIG. 18 shows details of the group of fixed resonating elements 244 illustrated in FIGS. 13 and 14 according to another embodiment of the group of fixed resonating elements 244. The group of fixed resonating elements 244 illustrated in FIG. 18, includes multiple series resonating elements 246 coupled in series between the first node FN and the second node SN, and includes a shunt resonating element 248 coupled between the first node FN and ground, a shunt resonating element 248, coupled between the second node SN and ground, and a shunt resonating element 248 coupled to each corresponding junction between a pair of the series resonating elements 246. In an alternate embodiment of the group of fixed resonating elements 244, the shunt resonating element 248 coupled between the first node FN and ground is omitted. In an additional embodiment of the group of fixed resonating elements 244, the shunt resonating element 248 coupled between the second node SN and ground is omitted. In another embodiment of the group of fixed resonating elements 244, the shunt resonating element 248 coupled between the first node FN and ground is omitted and the shunt resonating element 248 coupled between the second node SN and ground is omitted.

Each of the series resonating elements 246 of each of the alpha sub-band bandpass filters 124, 126, 128 may have a corresponding anti-resonant frequency, which may determine the alpha upper passband edges 160, 178, 196, 214 (FIGS. 9A, 9B, 9C, and 9D) of the alpha sub-band bandpass filters 124, 126, 128. Each of the shunt resonating elements 248 of each of the alpha sub-band bandpass filters 124, 126, 128 may have a corresponding resonant frequency, which may determine the alpha lower passband edges 158, 176, 194, 212 (FIGS. 9A, 9B, 9C, and 9D) of the alpha sub-band bandpass filters 124, 126, 128. Similarly, each of the series resonating elements 246 of each of the beta sub-band band pass filters 144, 146, 148 may have a corresponding anti-resonant frequency, which may determine the beta upper passband edges 168, 186, 204, 222 (FIGS. 9A, 9B, 9C, and 9D) of the beta sub-band band pass filters 144, 146, 148. Each of the shunt resonating element 248 of each of the beta sub-band band pass filters 144, 146, 148 may have a corresponding resonant frequency, which may determine the beta lower passband edges 166, 184, 202, 220 (FIGS. 9A, 9B, 9C, and 9D) of the beta sub-band band pass filters 144, 146, 148.

Figure 19:
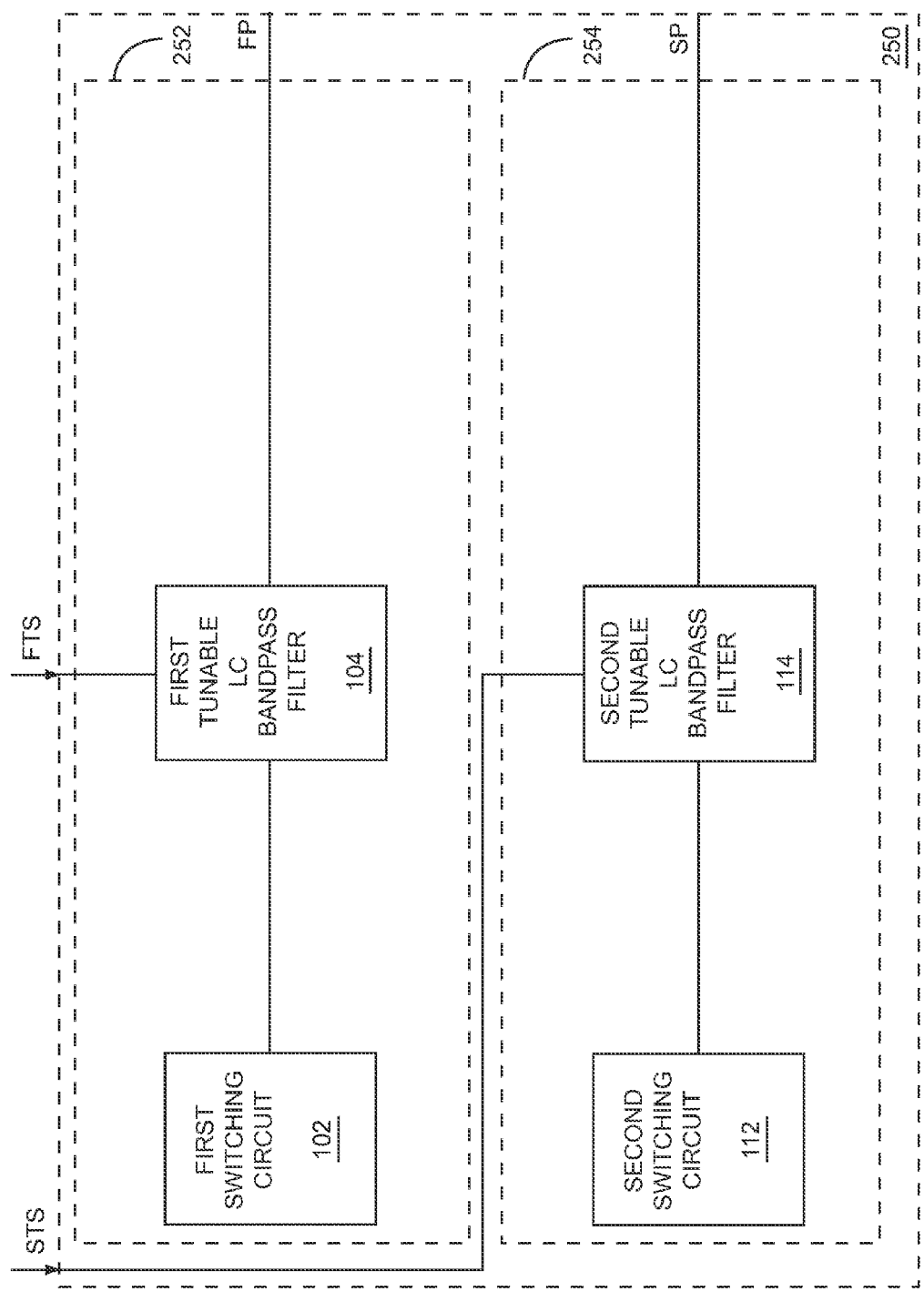
FIG. 19 shows details of a third portion of the passive multi-band duplexer illustrated in FIGS. 6 and 10 according to one embodiment of the third portion of the passive multi-band duplexer.

FIG. 19 shows details of a third portion 250 of the passive multi-band duplexer 58 illustrated in FIGS. 6 and 10 according to one embodiment of the third portion 250 of the passive multi-band duplexer 58. The third portion 250 of the passive multi-band duplexer 58 includes a first portion 252 of the first bandpass filter 66 and a first portion 254 of the second bandpass filter 68. The first portion 252 of the first bandpass filter 66 includes the first switching circuit 102 and the first tunable LC bandpass filter 104, such that the first tunable LC bandpass filter 104 is coupled between the first switching circuit 102 and the first port FP. The first portion 254 of the second bandpass filter 68 includes the second switching circuit 112 and the second tunable LC bandpass filter 114, such that the second tunable LC bandpass filter 114 is coupled between the second switching circuit 112 and the second port SP.

Figure 20:
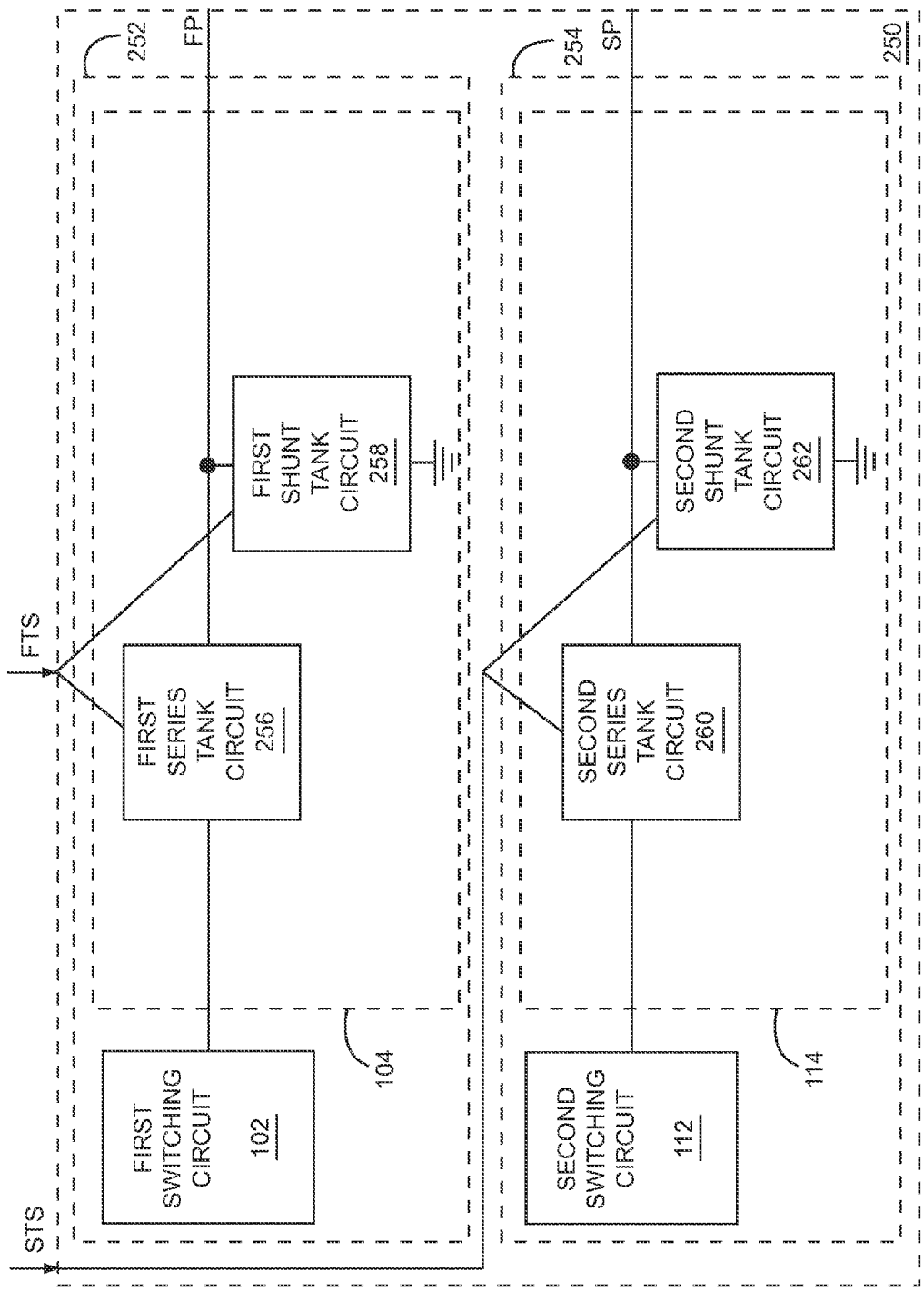
FIG. 20 shows details of the third portion of the passive multi-band duplexer illustrated in FIGS. 6 and 10 according to an alternate embodiment of the third portion of the passive multi-band duplexer.

FIG. 20 shows details of the third portion 250 of the passive multi-band duplexer 58 illustrated in FIGS. 6 and 10 according to an alternate embodiment of the third portion 250 of the passive multi-band duplexer 58. The third portion 250 of the passive multi-band duplexer 58 illustrated in FIG. 20 shows details of the first tunable LC bandpass filter 104 and the second tunable LC bandpass filter 114 illustrated in FIG. 19. The first tunable LC bandpass filter 104 includes a first series tank circuit 256 and a first shunt tank circuit 258, such that the first series tank circuit 256 is coupled between the first switching circuit 102 and the first port FP, and the first shunt tank circuit 258 is coupled between the first port FP and ground. The second tunable LC bandpass filter 114 includes a second series tank circuit 260 and a second shunt tank circuit 262, such that the second series tank circuit 260 is coupled between the second switching circuit 112 and the second port SP, and the second shunt tank circuit 262 is coupled between the second port SP and ground.

Both the first series tank circuit 256 and the first shunt tank circuit 258 receive the first tuning signal FTS. As such, the control circuitry 60 (FIG. 3) can tune both the first series tank circuit 256 and the first shunt tank circuit 258 via the first tuning signal FTS. Both the second series tank circuit 260 and the second shunt tank circuit 262 receive the second tuning signal STS. As such, the control circuitry 60 (FIG. 3) can tune both the second series tank circuit 260 and the second shunt tank circuit 262 via the second tuning signal STS.

Figure 21:
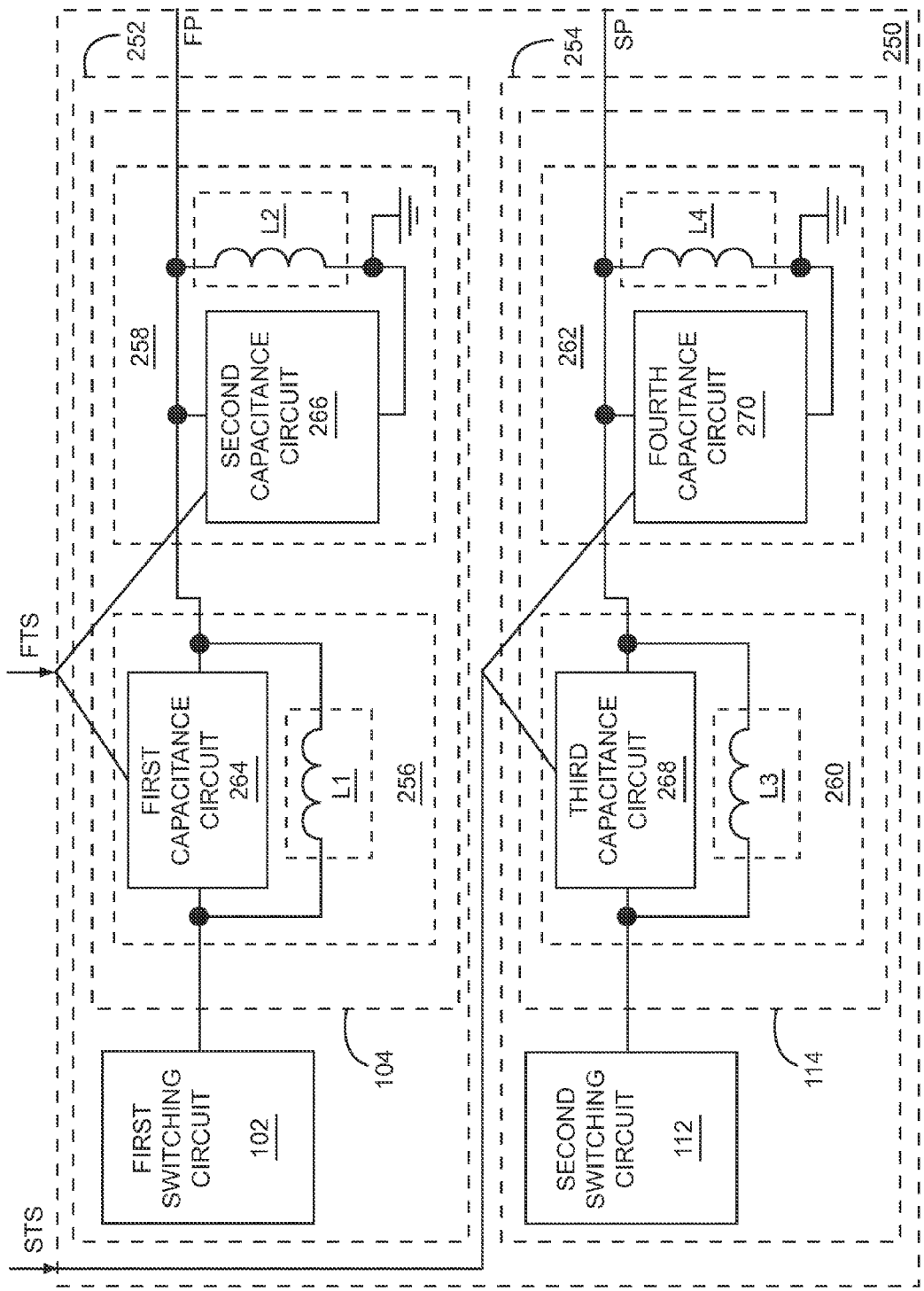
FIG. 21 shows details of the third portion of the passive multi-band duplexer illustrated in FIGS. 6 and 10 according to an additional embodiment of the third portion of the passive multi-band duplexer.

FIG. 21 shows details of the third portion 250 of the passive multi-band duplexer 58 illustrated in FIGS. 6 and 10 according to an additional embodiment of the third portion 250 of the passive multi-band duplexer 58. The third portion 250 of the passive multi-band duplexer 58 illustrated in FIG. 21 shows details of the first series tank circuit 256, the first shunt tank circuit 258, the second series tank circuit 260, and the second shunt tank circuit 262 illustrated in FIG. 20. The first series tank circuit 256 includes a first inductive element L1 coupled between the first switching circuit 102 and the first port FP, and includes a first capacitance circuit 264 coupled across the first inductive element L1. The first shunt tank circuit 258 includes a second inductive element L2 coupled between the first port FP and ground, and includes a second capacitance circuit 266 coupled across the second inductive element L2.

The second series tank circuit 260 includes a third inductive element L3 coupled between the second switching circuit 112 and the second port SP, and includes a third capacitance circuit 268 coupled across the third inductive element L3. The second shunt tank circuit 262 includes a fourth inductive element L4 coupled between the second port SP and ground, and includes a fourth capacitance circuit 270 coupled across the fourth inductive element L4. The first capacitance circuit 264, the second capacitance circuit 266, the third capacitance circuit 268, and the fourth capacitance circuit 270 may all be tunable. Both the first capacitance circuit 264 and the second capacitance circuit 266 receive the first tuning signal FTS. Both the third capacitance circuit 268 and the fourth capacitance circuit 270 receive the second tuning signal STS. As such, the control circuitry 60 (FIG. 3) can select capacitances of the first capacitance circuit 264 and the second capacitance circuit 266 via the first tuning signal FTS to tune the first tunable LC bandpass filter 104, and the control circuitry 60 (FIG. 3) can select capacitances of the third capacitance circuit 268 and the fourth capacitance circuit 270 via the second tuning signal STS to tune the second tunable LC bandpass filter 114.

Figure 22:
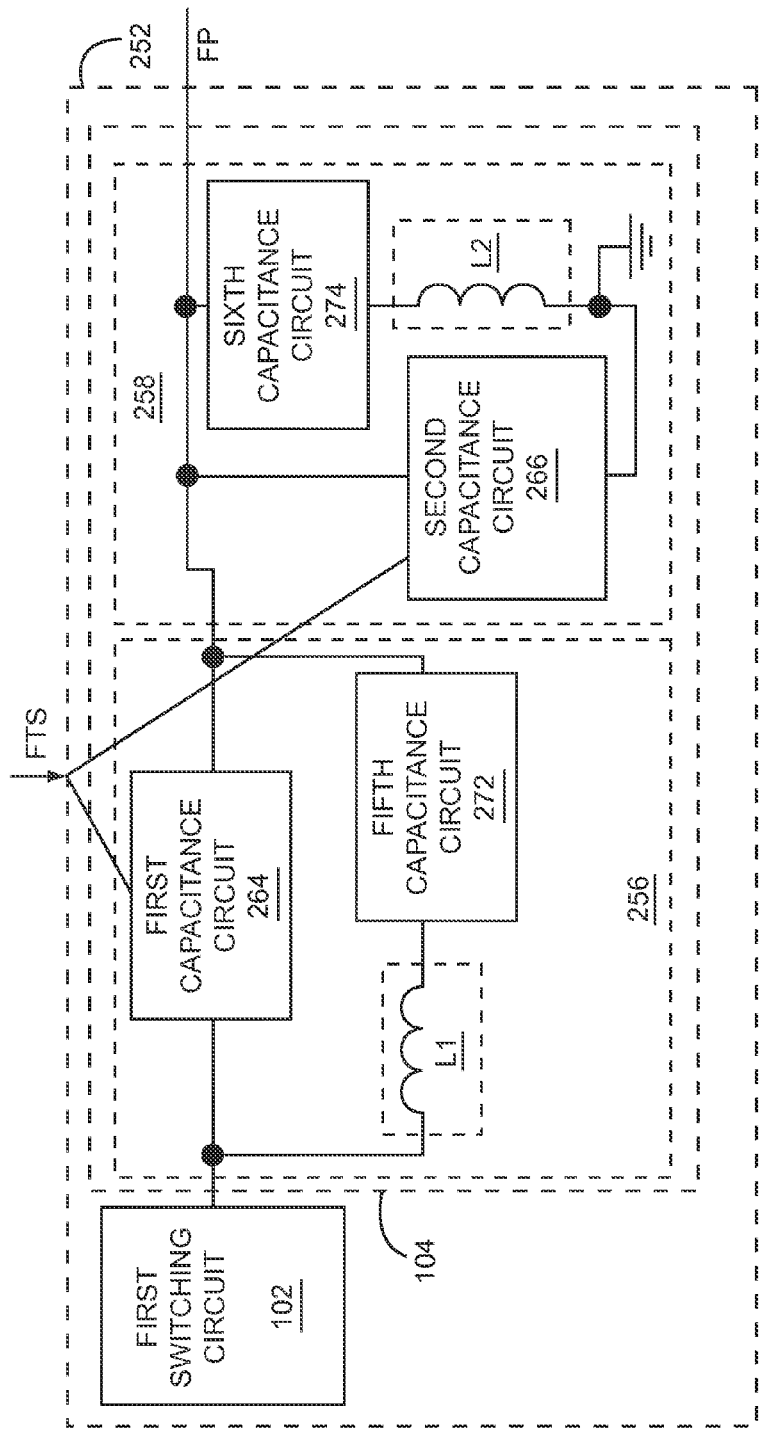
FIG. 22 shows details of a first portion of the first bandpass filter illustrated in FIG. 20 according to one embodiment of the first portion of the first bandpass filter.

FIG. 22 shows details of the first portion 252 of the first bandpass filter 66 illustrated in FIG. 20 according to one embodiment of the first portion 252 of the first bandpass filter 66. The first series tank circuit 256 and the first shunt tank circuit 258 illustrated in FIG. 22 are similar to the first series tank circuit 256 and the first shunt tank circuit 258 illustrated in FIG. 21, except the first series tank circuit 256 illustrated in FIG. 22 further includes a fifth capacitance circuit 272 coupled in series with the first inductive element L1 and the first shunt tank circuit 258 illustrated in FIG. 22 further includes a sixth capacitance circuit 274 coupled in series with the second inductive element L2. The first capacitance circuit 264 is coupled across the series coupling of the first inductive element L1 and the fifth capacitance circuit 272. The second capacitance circuit 266 is coupled across the series coupling of the second inductive element L2 and the sixth capacitance circuit 274. In the embodiment of the fifth capacitance circuit 272 and the sixth capacitance circuit 274 illustrated in FIG. 22, the fifth capacitance circuit 272 and the sixth capacitance circuit 274 are fixed capacitance circuits.

Figure 23:
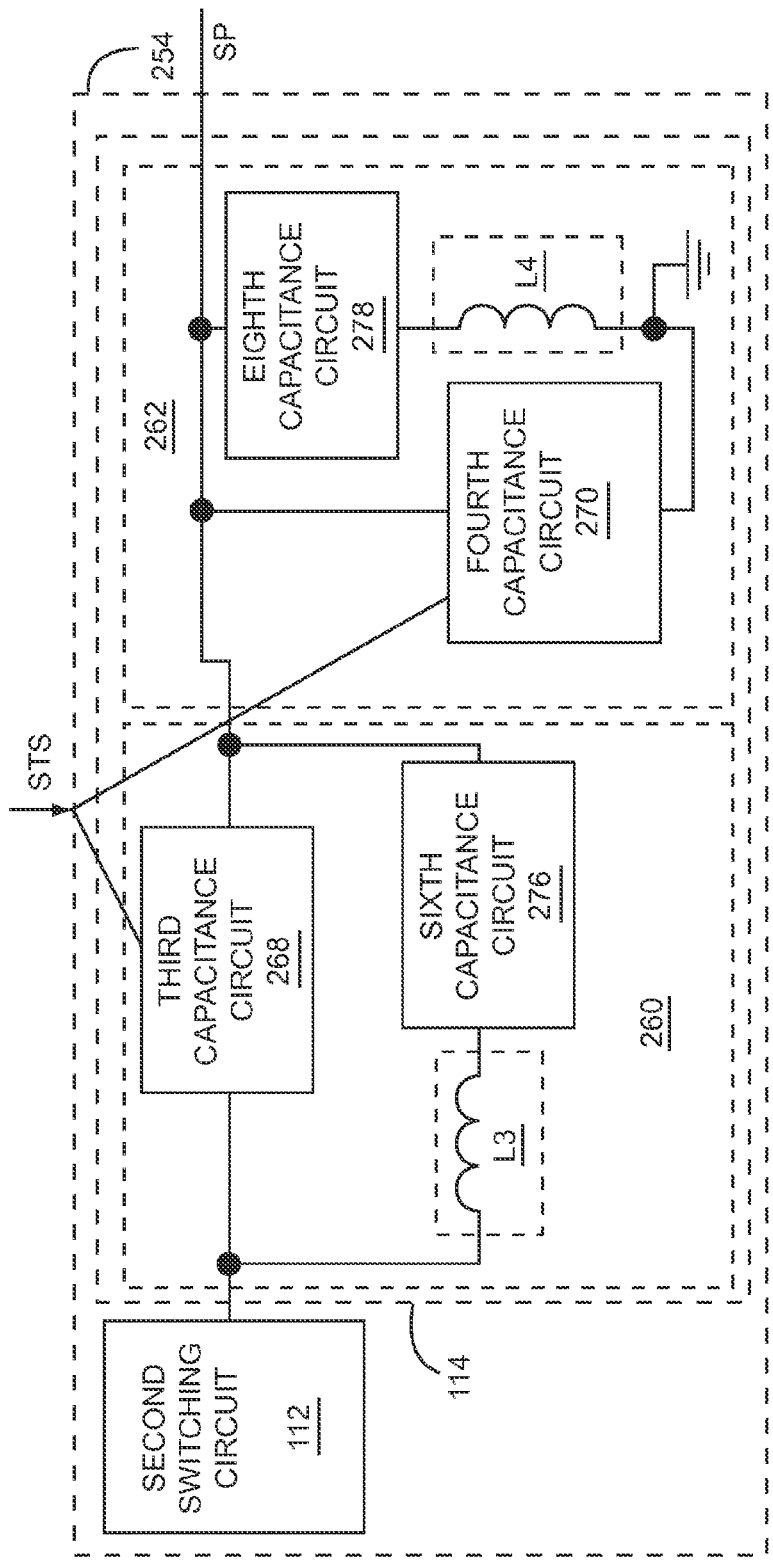
FIG. 23 shows details of a first portion of the second bandpass filter illustrated in FIG. 20 according to one embodiment of the first portion of the second bandpass filter 68.

FIG. 23 shows details of the first portion 254 of the second bandpass filter 68 illustrated in FIG. 20 according to one embodiment of the first portion 254 of the second bandpass filter 68. The second series tank circuit 260 and the second shunt tank circuit 262 illustrated in FIG. 23 are similar to the second series tank circuit 260 and the second shunt tank circuit 262 illustrated in FIG. 21, except the second series tank circuit 260 illustrated in FIG. 23 further includes a seventh capacitance circuit 276 coupled in series with the third inductive element L3 and the second shunt tank circuit 262 illustrated in FIG. 23 further includes an eighth capacitance circuit 278 coupled in series with the fourth inductive element L4. The third capacitance circuit 268 is coupled across the series coupling of the third inductive element L3 and the seventh capacitance circuit 276. The fourth capacitance circuit 270 is coupled across the series coupling of the fourth inductive element L4 and the eighth capacitance circuit 278. In the embodiment of the seventh capacitance circuit 276 and the eighth capacitance circuit 278 illustrated in FIG. 23, the seventh capacitance circuit 276 and the eighth capacitance circuit 278 are fixed capacitance circuits.

Figure 24:
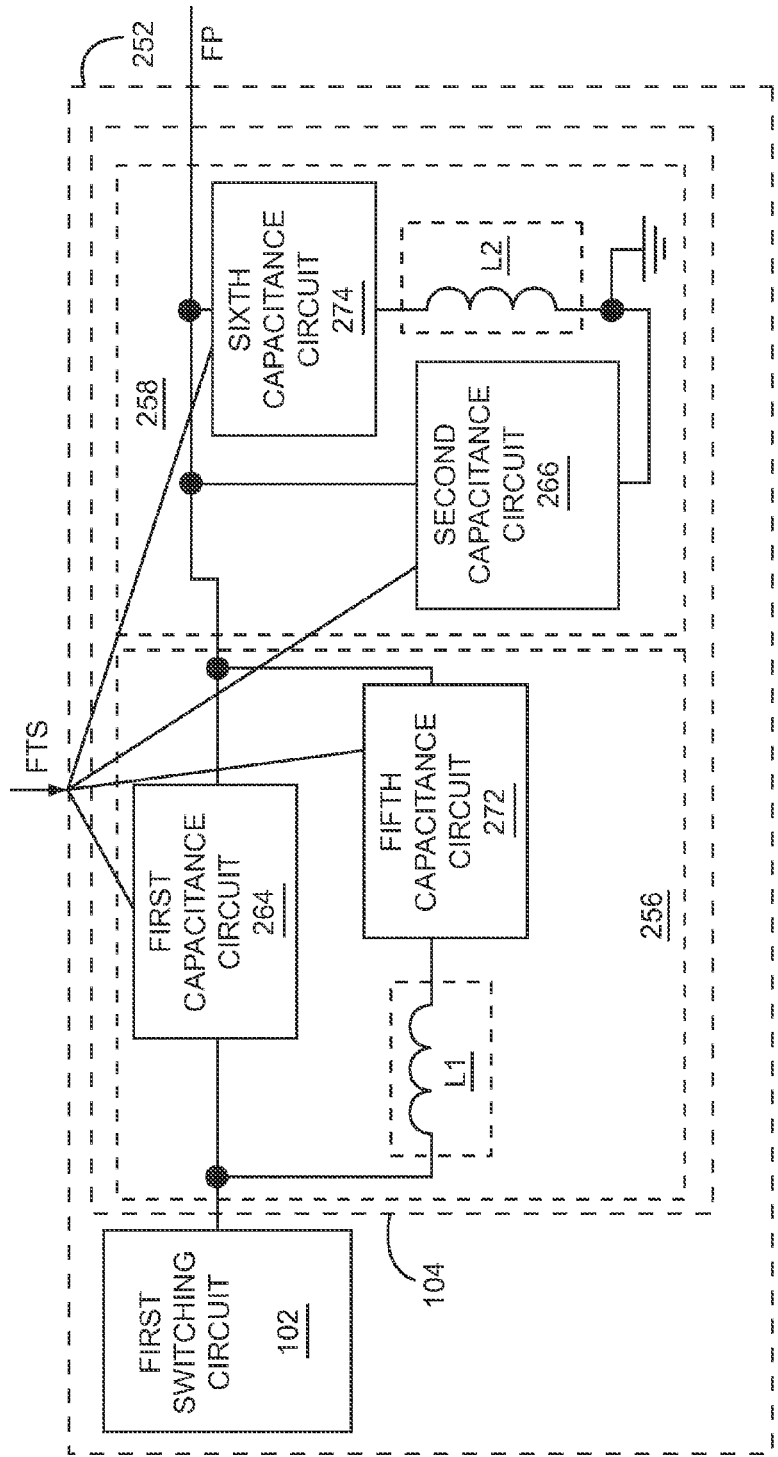
FIG. 24 shows details of the first portion of the first bandpass filter illustrated in FIG. 20 according to an alternate embodiment of the first portion of the first bandpass filter.

FIG. 24 shows details of the first portion 252 of the first bandpass filter 66 illustrated in FIG. 20 according to an alternate embodiment of the first portion 252 of the first bandpass filter 66. The first series tank circuit 256 and the first shunt tank circuit 258 illustrated in FIG. 24 are similar to the first series tank circuit 256 and the first shunt tank circuit 258 illustrated in FIG. 21, except the first series tank circuit 256 illustrated in FIG. 24 further includes the fifth capacitance circuit 272 coupled in series with the first inductive element L1 and the first shunt tank circuit 258 illustrated in FIG. 24 further includes the sixth capacitance circuit 274 coupled in series with the second inductive element L2. The first capacitance circuit 264 is coupled across the series coupling of the first inductive element L1 and the fifth capacitance circuit 272. The second capacitance circuit 266 is coupled across the series coupling of the second inductive element L2 and the sixth capacitance circuit 274. In the embodiment of the fifth capacitance circuit 272 and the sixth capacitance circuit 274 illustrated in FIG. 24, the fifth capacitance circuit 272 and the sixth capacitance circuit 274 are tunable capacitance circuits.

Figure 25:
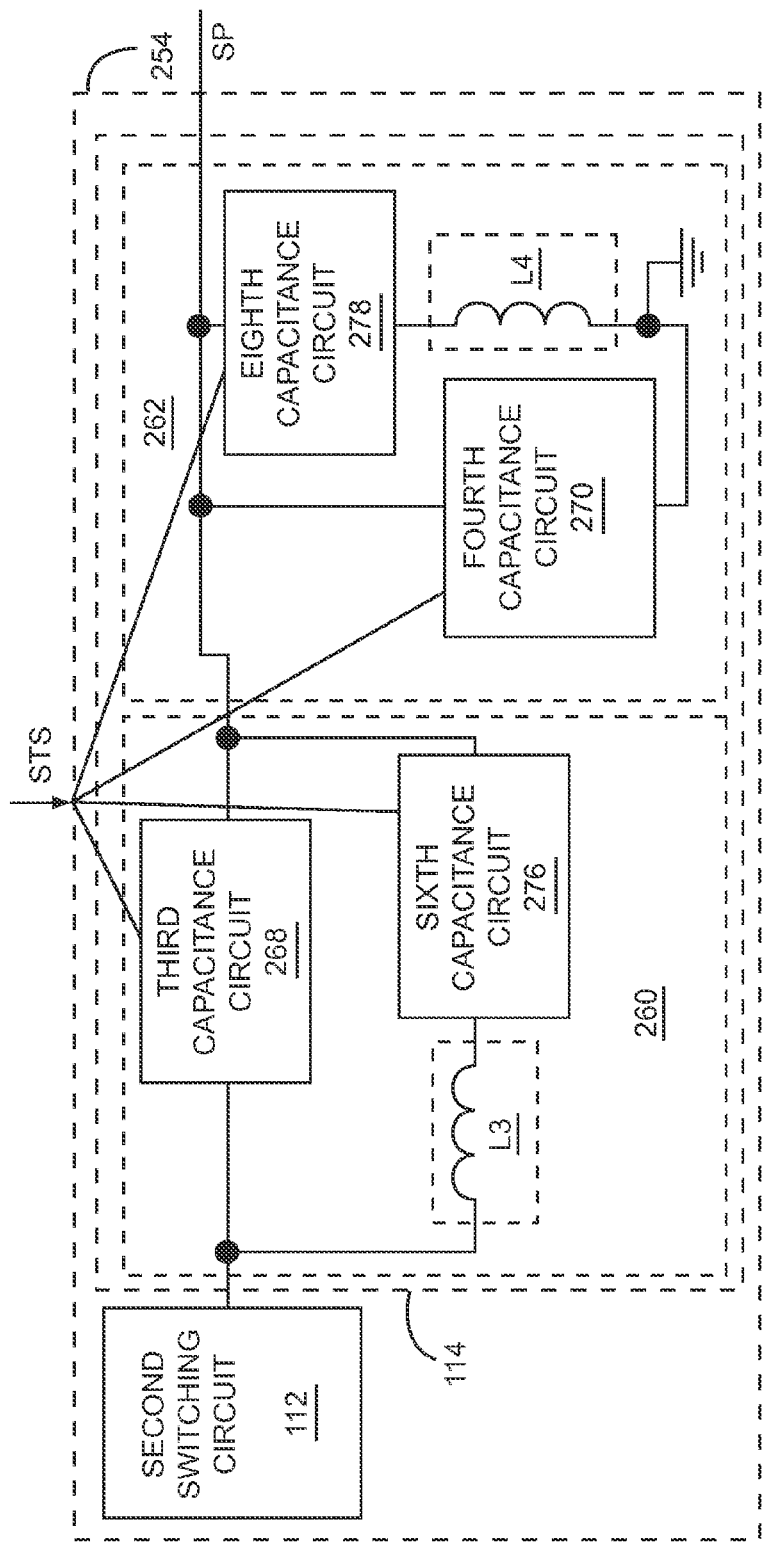
FIG. 25 shows details of the first portion of the second bandpass filter illustrated in FIG. 20 according to an alternate embodiment of the first portion of the second bandpass filter 68.

FIG. 25 shows details of the first portion 254 of the second bandpass filter 68 illustrated in FIG. 20 according to an alternate embodiment of the first portion 254 of the second bandpass filter 68. The second series tank circuit 260 and the second shunt tank circuit 262 illustrated in FIG. 25 are similar to the second series tank circuit 260 and the second shunt tank circuit 262 illustrated in FIG. 21, except the second series tank circuit 260 illustrated in FIG. 25 further includes the seventh capacitance circuit 276 coupled in series with the third inductive element L3 and the second shunt tank circuit 262 illustrated in FIG. 25 further includes the eighth capacitance circuit 278 coupled in series with the fourth inductive element L4. The third capacitance circuit 268 is coupled across the series coupling of the third inductive element L3 and the seventh capacitance circuit 276. The fourth capacitance circuit 270 is coupled across the series coupling of the fourth inductive element L4 and the eighth capacitance circuit 278. In the embodiment of the seventh capacitance circuit 276 and the eighth capacitance circuit 278 illustrated in FIG. 25, the seventh capacitance circuit 276 and the eighth capacitance circuit 278 are tunable capacitance circuits.

Figure 26:
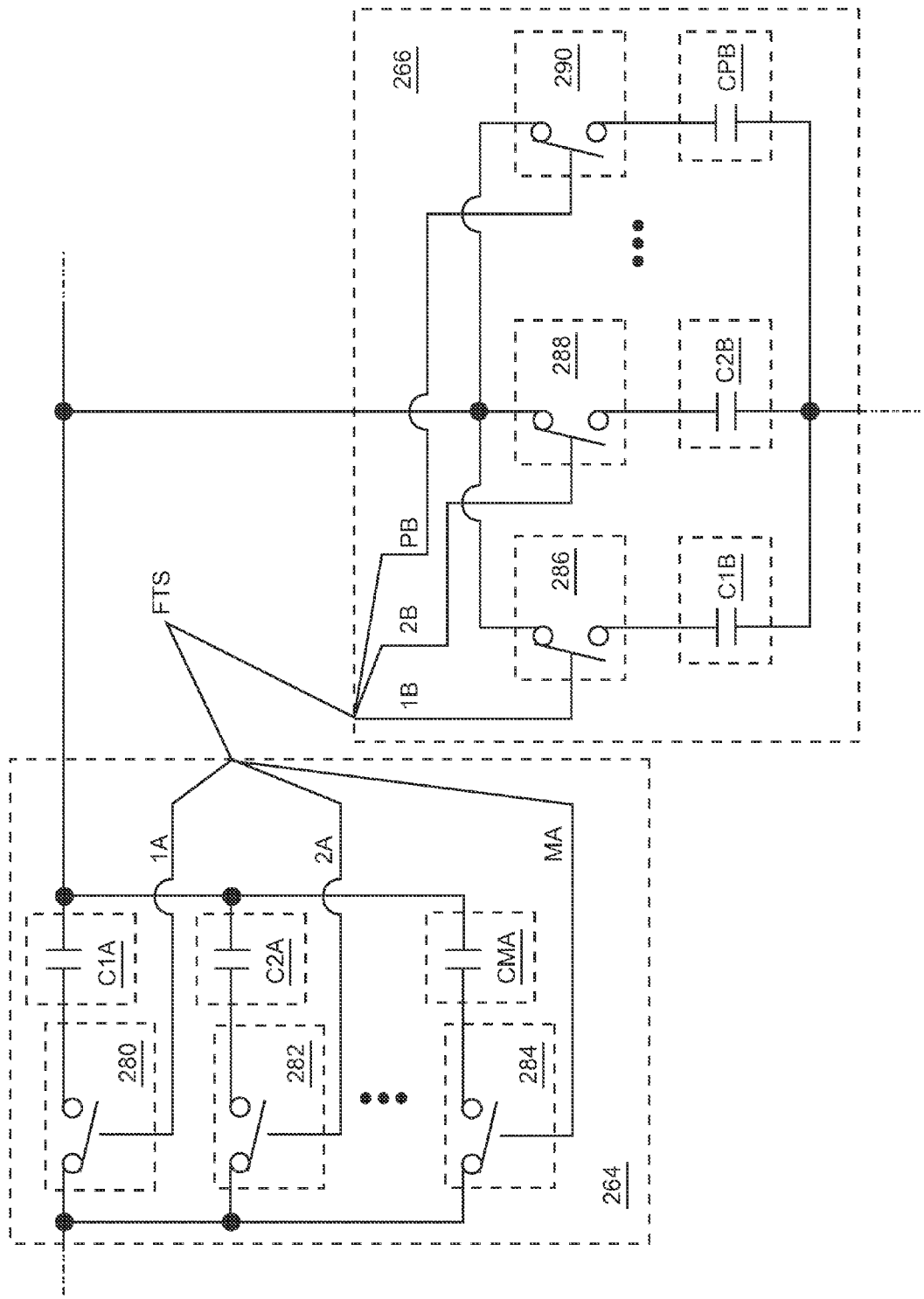
FIG. 26 shows details of a first capacitance circuit and a second capacitance circuit illustrated in FIGS. 21, 22, and 24 according to one embodiment of the first capacitance circuit and the second capacitance circuit.

FIG. 26 shows details of the first capacitance circuit 264 and the second capacitance circuit 266 illustrated in FIGS. 21, 22, and 24 according to one embodiment of the first capacitance circuit 264 and the second capacitance circuit 266. The first capacitance circuit 264 includes a first alpha capacitance switching element 280, a second alpha capacitance switching element 282, and up to and including an $M^{TH}$ alpha capacitance switching element 284. The first capacitance circuit 264 further includes a first alpha capacitive element C1A, a second alpha capacitive element C2A, and up to and including an $M^{TH}$ alpha capacitive element CMA. The first alpha capacitance switching element 280 is coupled in series with the first alpha capacitive element C1A. The second alpha capacitance switching element 282 is coupled in series with the second alpha capacitive element C2A. The $M^{TH}$ alpha capacitance switching element 284 is coupled in series with the $M^{TH}$ alpha capacitive element CMA. A control input to the first alpha capacitance switching element 280 receives a first alpha bit 1A of the first tuning signal FTS. A control input to the second alpha capacitance switching element 282 receives a second alpha bit 2A of the first tuning signal FTS. A control input to the $M^{TH}$ alpha capacitance switching element 284 receives the $M^{TH}$ alpha bit MA of the first tuning signal FTS.

The second capacitance circuit 266 includes a first beta capacitance switching element 286, a second beta capacitance switching element 288, and up to and including a $P^{TH}$ beta capacitance switching element 290. The second capacitance circuit 266 further includes a first beta capacitive element C1B, a second beta capacitive element C2B, and up to and including a $P^{TH}$ beta capacitive element CPB. The first beta capacitance switching element 286 is coupled in series with the first beta capacitive element C1B. The second beta capacitance switching element 288 is coupled in series with the second beta capacitive element C2B. The $P^{TH}$ beta capacitance switching element 290 is coupled in series with the $P^{TH}$ beta capacitive element CPB. A control input to the first beta capacitance switching element 286 receives a first beta bit 1B of the first tuning signal FTS. A control input to the second beta capacitance switching element 288 receives a second beta bit 2B of the first tuning signal FTS. A control input to the $P^{TH}$ beta capacitance switching element 290 receives a $P^{TH}$ beta bit PB of the first tuning signal FTS.

Figure 27:
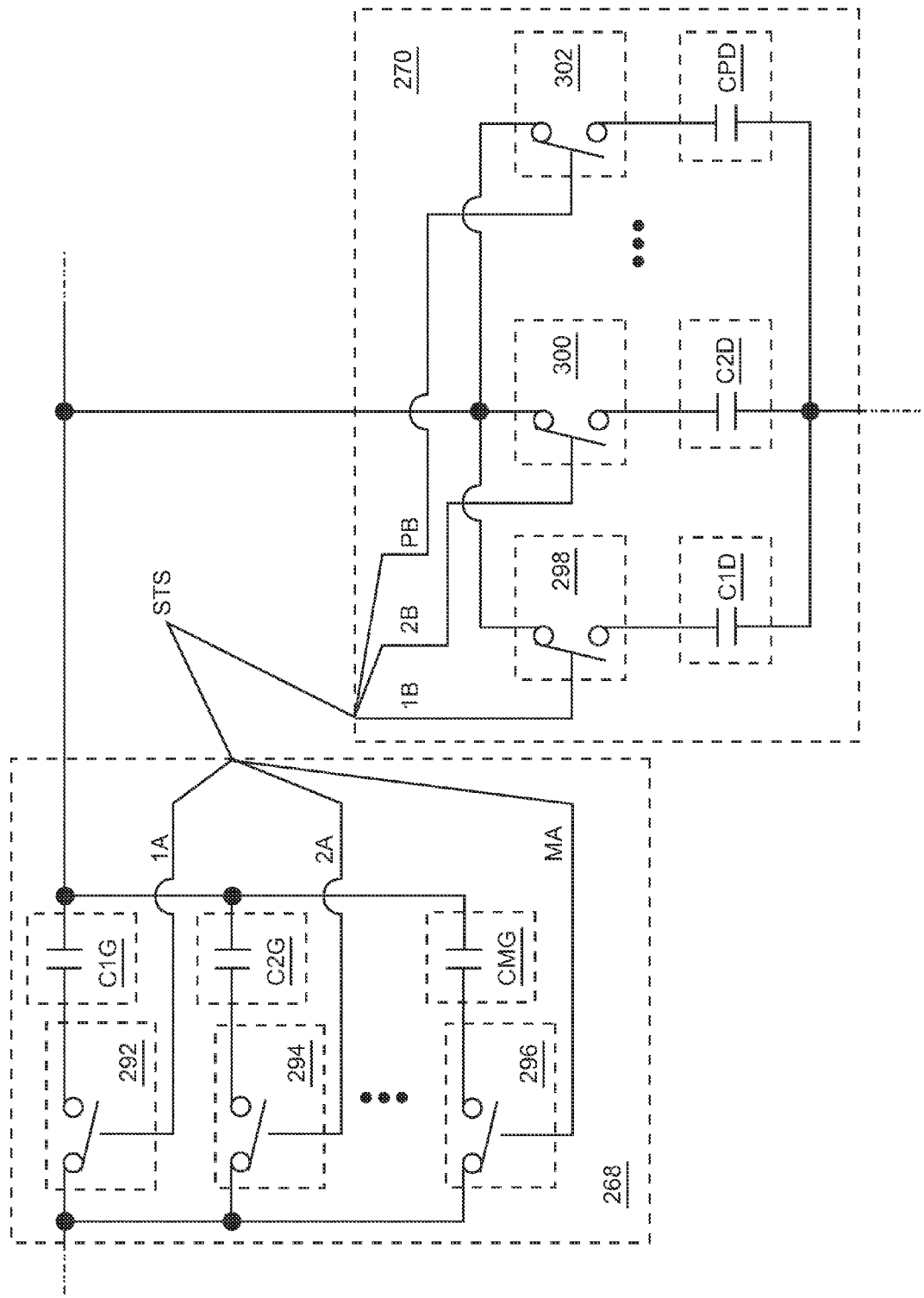
FIG. 27 shows details of a third capacitance circuit and a fourth capacitance circuit illustrated in FIGS. 21, 23, and 24 according to one embodiment of the third capacitance circuit and the fourth capacitance circuit.

FIG. 27 shows details of the third capacitance circuit 268 and the fourth capacitance circuit 270 illustrated in FIGS. 21, 23, and 24 according to one embodiment of the third capacitance circuit 268 and the fourth capacitance circuit 270. The third capacitance circuit 268 includes a first gamma capacitance switching element 292, a second gamma capacitance switching element 294, and up to and including an $M^{TH}$ gamma capacitance switching element 296. The third capacitance circuit 268 further includes a first gamma capacitive element C1G, a second gamma capacitive element C2G, and up to and including an $M^{TH}$ gamma capacitive element CMG. The first gamma capacitance switching element 292 is coupled in series with the first gamma capacitive element C1G. The second gamma capacitance switching element 294 is coupled in series with the second gamma capacitive element C2G. The $M^{TH}$ gamma capacitance switching element 296 is coupled in series with the $M^{TH}$ gamma capacitive element CMG. A control input to the first gamma capacitance switching element 292 receives a first alpha bit 1A of the second tuning signal STS. A control input to the second gamma capacitance switching element 294 receives a second alpha bit 2A of the second tuning signal STS. A control input to the $M^{TH}$ gamma capacitance switching element 296 receives an $M^{TH}$ alpha bit MA of the second tuning signal STS.

The fourth capacitance circuit 270 includes a first delta capacitance switching element 298, a second delta capacitance switching element 300, and up to and including a $P^{TH}$ delta capacitance switching element 302. The fourth capacitance circuit 270 further includes a first delta capacitive element C1D, a second delta capacitive element C2D, and up to and including a $P^{TH}$ delta capacitive element CPD. The first delta capacitance switching element 298 is coupled in series with the first delta capacitive element C1D. The second delta capacitance switching element 300 is coupled in series with the second delta capacitive element C2D. The $P^{TH}$ delta capacitance switching element 302 is coupled in series with the $P^{TH}$ delta capacitive element CPD. A control input to the first delta capacitance switching element 298 receives a first beta bit 1B of the second tuning signal STS. A control input to the second delta capacitance switching element 300 receives a second beta bit 2B of the second tuning signal STS. A control input to the $P^{TH}$ delta capacitance switching element 302 receives a $P^{TH}$ beta bit PB of the second tuning signal STS.

Figure 28:
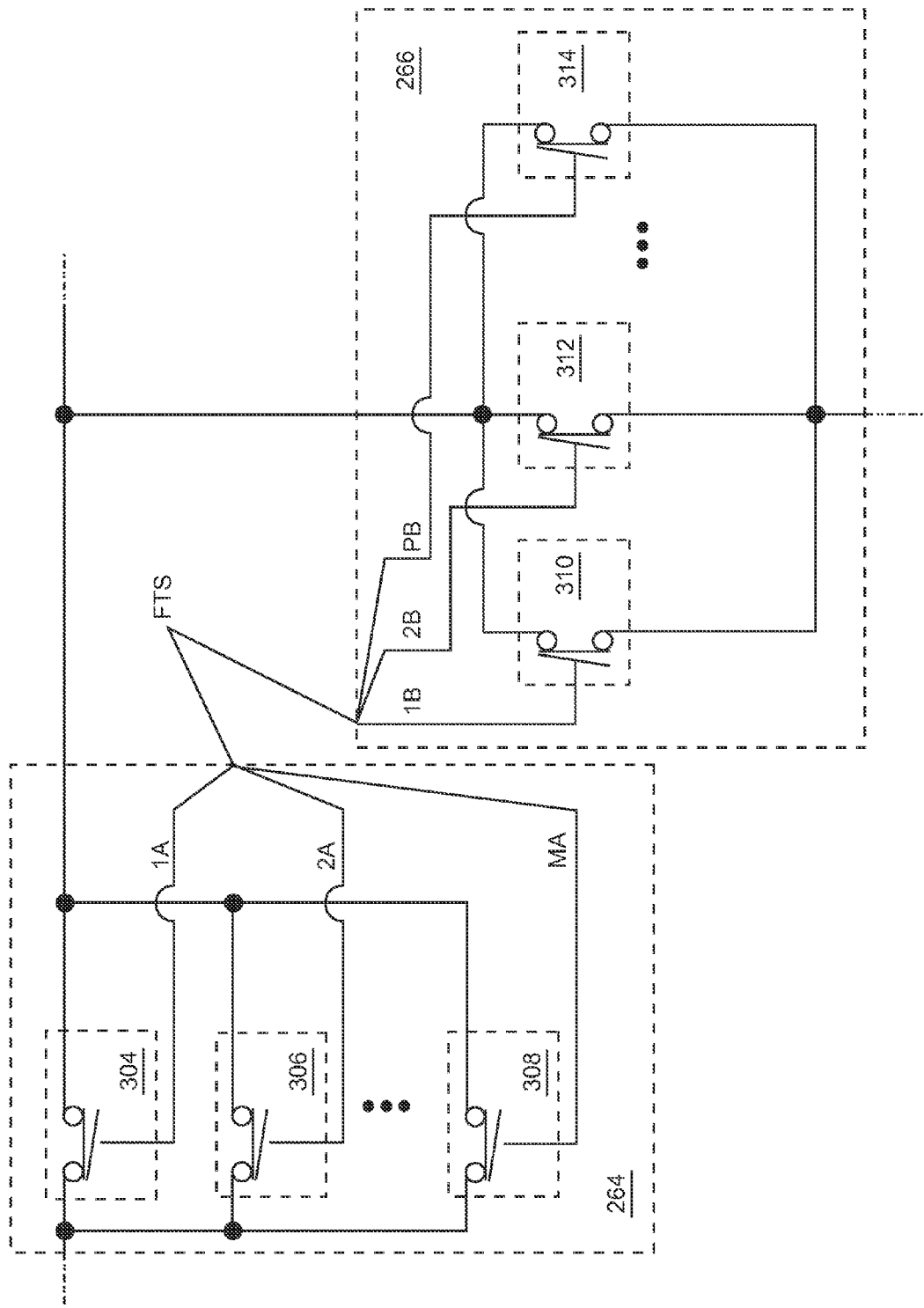
FIG. 28 shows details of the first capacitance circuit and the second capacitance circuit illustrated in FIGS. 21, 22, and 24 according to an alternate embodiment of the first capacitance circuit and the second capacitance circuit.

FIG. 28 shows details of the first capacitance circuit 264 and the second capacitance circuit 266 illustrated in FIGS. 21, 22, and 24 according to an alternate embodiment of the first capacitance circuit 264 and the second capacitance circuit 266. The first capacitance circuit 264 includes a first alpha MEMS selectable capacitance element 304, a second alpha MEMS selectable capacitance element 306, and up to and including an $M^{TH}$ alpha MEMS selectable capacitance element 308. The alpha MEMS selectable capacitance elements 304, 306, 308 may be coupled in parallel to one another. Each of the alpha MEMS selectable capacitance elements 304, 306, 308 may have a fixed capacitive plate and a movable capacitive plate, which are insulated from one another. When actuated, the movable capacitive plate moves toward the fixed capacitive plate, thereby increasing the capacitance of the actuated alpha MEMS selectable capacitance elements 304, 306, 308.

The second capacitance circuit 266 includes a first beta MEMS selectable capacitance element 310, a second beta MEMS selectable capacitance element 312, and up to and including a $P^{TH}$ beta MEMS selectable capacitance element 314. The beta MEMS selectable capacitance elements 310, 312, 314 may be coupled in parallel to one another.

Figure 29:
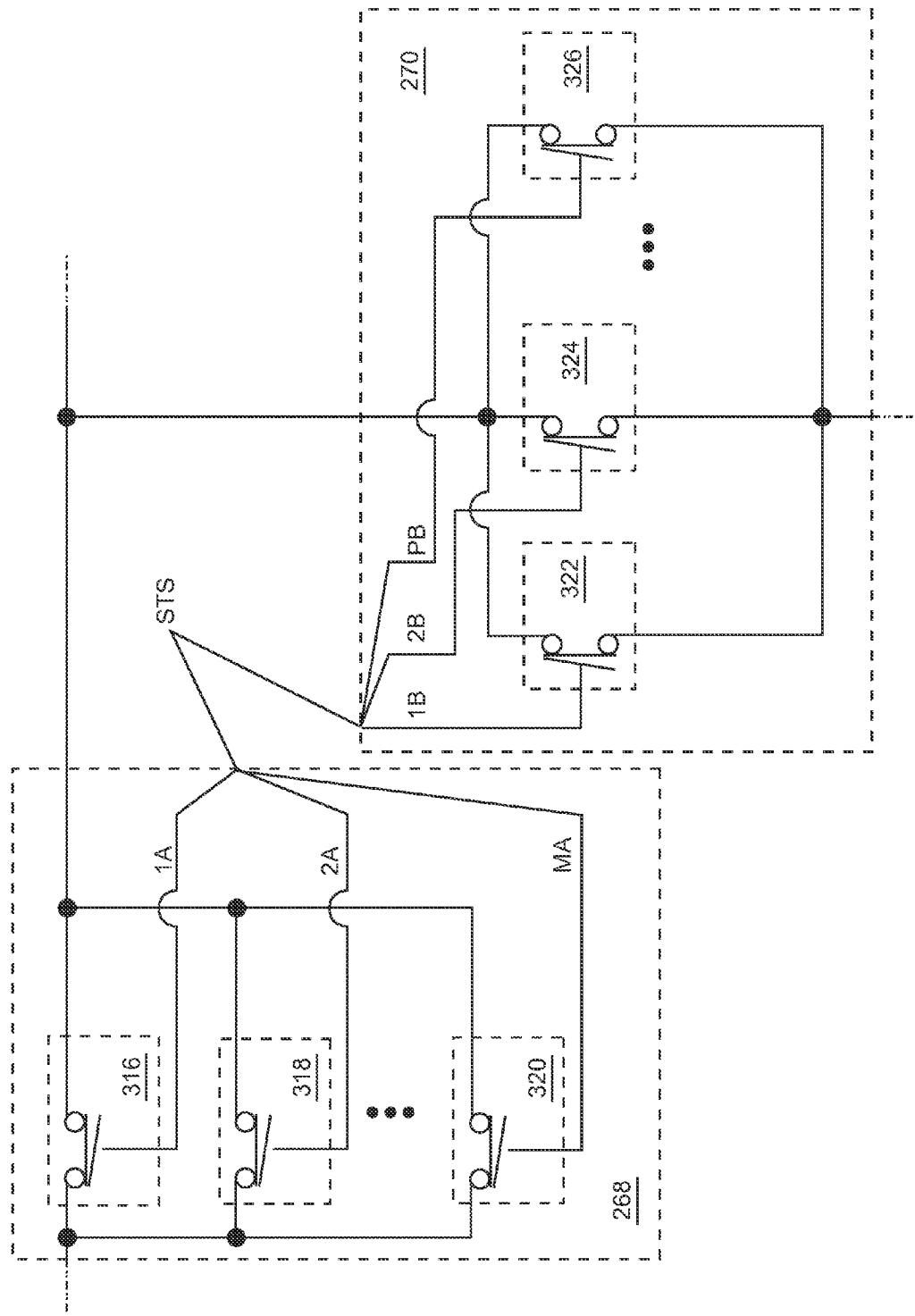
FIG. 29 shows details of the third capacitance circuit and the fourth capacitance circuit illustrated in FIGS. 21, 23, and 24 according to an alternate embodiment of the third capacitance circuit and the fourth capacitance circuit.

FIG. 29 shows details of the third capacitance circuit 268 and the fourth capacitance circuit 270 illustrated in FIGS. 21, 23, and 24 according to an alternate embodiment of the third capacitance circuit 268 and the fourth capacitance circuit 270. The third capacitance circuit 268 includes a first gamma MEMS selectable capacitance element 316, a second gamma MEMS selectable capacitance element 318, and up to and including an $M^{TH}$ gamma MEMS selectable capacitance element 320. The gamma MEMS selectable capacitance elements 316, 318, 320 may be coupled in parallel to one another. The fourth capacitance circuit 270 includes a first delta MEMS selectable capacitance element 322, a second delta MEMS selectable capacitance element 324, and up to and including a $P^{TH}$ delta MEMS selectable capacitance element 326. The delta MEMS selectable capacitance elements 322, 324, 326 may be coupled in parallel to one another.

Figure 30:
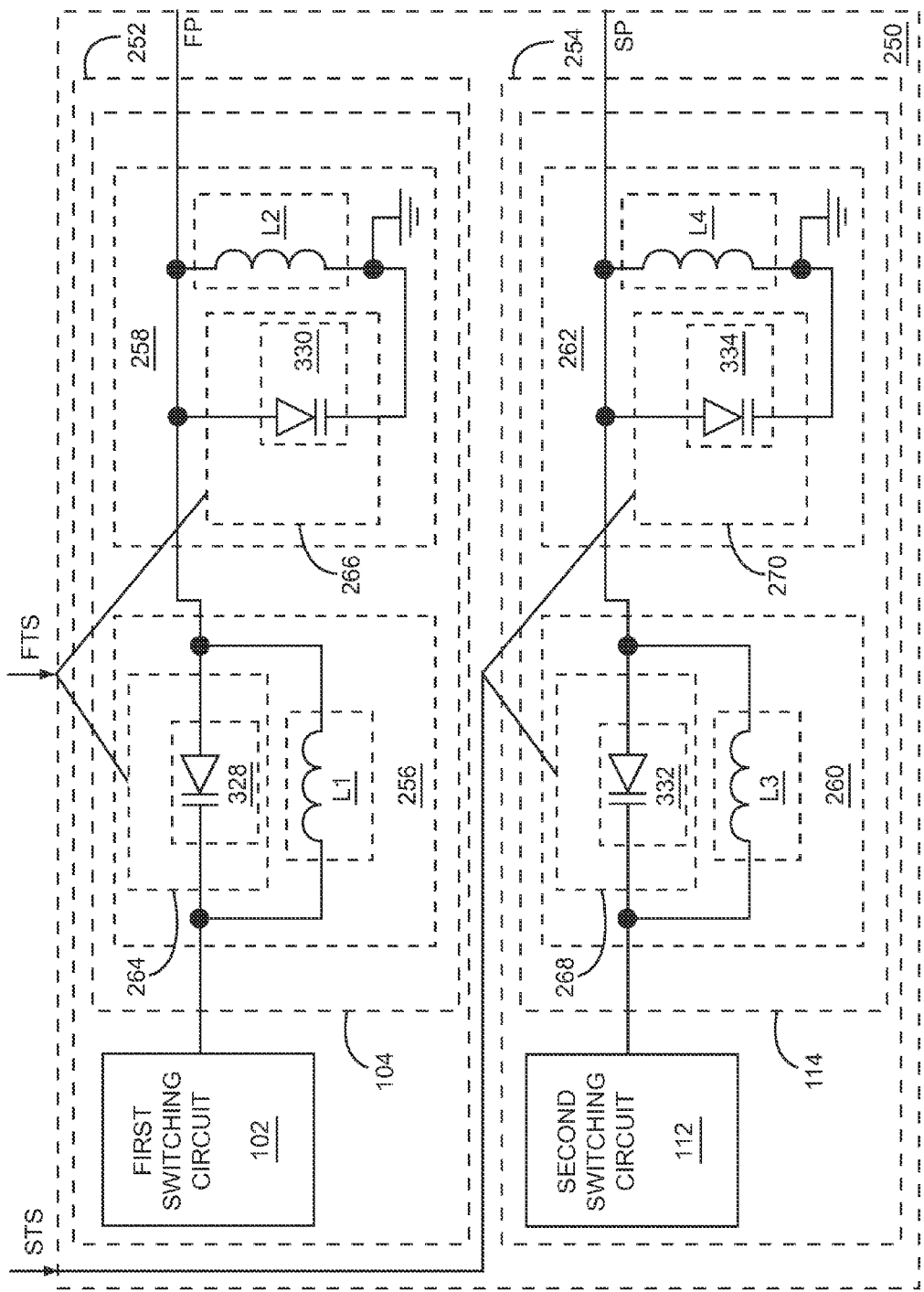
FIG. 30 shows details of the third portion of the passive multi-band duplexer illustrated in FIG. 21 according to another embodiment of the third portion of the passive multi-band duplexer.

FIG. 30 shows details of the third portion 250 of the passive multi-band duplexer 58 illustrated in FIG. 21 according to another embodiment of the third portion 250 of the passive multi-band duplexer 58. The first capacitance circuit 264 includes a first varactor diode element 328, the second capacitance circuit 266 includes a second varactor diode element 330, the third capacitance circuit 268 includes a third varactor diode element 332, and the fourth capacitance circuit 270 includes a fourth varactor diode element 334.

Figure 31:
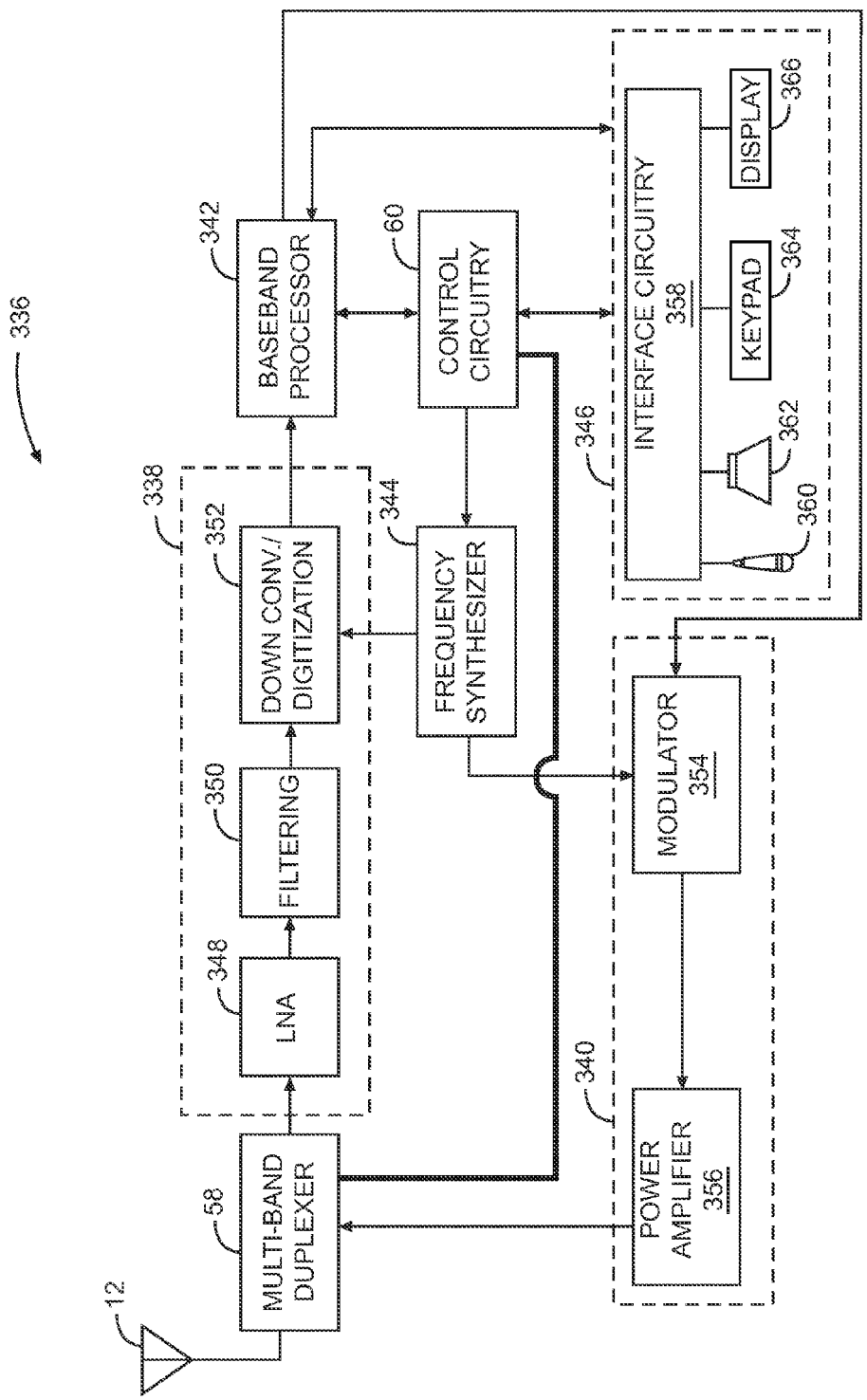
FIG. 31 shows an application example of the present disclosure used in a mobile terminal.

An application example of the passive multi-band duplexer 58 is its use in a mobile terminal 336, the basic architecture of which is represented in FIG. 31. The mobile terminal 336 may include a receiver front end 338, a radio frequency transmitter section 340, the antenna 12, the passive multi-band duplexer 58, a baseband processor 342, the control circuitry 60, a frequency synthesizer 344, and an interface 346. The receiver front end 338 receives information bearing radio frequency signals from one or more remote transmitters provided by a base station (not shown). A low noise amplifier (LNA) 348 amplifies the signal. A filter circuit 350 minimizes broadband interference in the received signal, while down conversion and digitization circuitry 352 down converts the filtered, received signal to an intermediate or baseband frequency signal, which is then digitized into one or more digital streams. The control circuitry 60 selects and tunes the passive multi-band duplexer 58 for the appropriate transmit and receive bands. The receiver front end 338 typically uses one or more mixing frequencies generated by the frequency synthesizer 344. The baseband processor 342 processes the digitized received signal to extract the information or data bits conveyed in the received signal. This processing typically comprises demodulation, decoding, and error correction operations. As such, the baseband processor 342 is generally implemented in one or more digital signal processors (DSPs).

On the transmit side, the baseband processor 342 receives digitized data, which may represent voice, data, or control information, from the control circuitry 60, which it encodes for transmission. The encoded data is output to the transmitter 340, where it is used by a modulator 354 to modulate a carrier signal that is at a desired transmit frequency. Power amplifier circuitry 356 amplifies the modulated carrier signal to a level appropriate for transmission, and delivers the amplified and modulated carrier signal to the antenna 12 through the passive multi-band duplexer 58.

A user may interact with the mobile terminal 336 via the interface 346, which may include interface circuitry 358 associated with a microphone 360, a speaker 362, a keypad 364, and a display 366. The interface circuitry 358 typically includes analog-to-digital converters, digital-to-analog converters, amplifiers, and the like. Additionally, it may include a voice encoder/decoder, in which case it may communicate directly with the baseband processor 342. The microphone 360 will typically convert audio input, such as the user's voice, into an electrical signal, which is then digitized and passed directly or indirectly to the baseband processor 342. Audio information encoded in the received signal is recovered by the baseband processor 342, and converted by the interface circuitry 358 into an analog signal suitable for driving the speaker 362. The keypad 364 and display 366 enable the user to interact with the mobile terminal 336, input numbers to be dialed, address book information, or the like, as well as monitor call progress information.

Some of the circuitry previously described may use discrete circuitry, integrated circuitry, programmable circuitry, non-volatile circuitry, volatile circuitry, software executing instructions on computing hardware, firmware executing instructions on computing hardware, the like, or any combination thereof. The computing hardware may include mainframes, micro-processors, micro-controllers, DSPs, the like, or any combination thereof.

None of the embodiments of the present disclosure are intended to limit the scope of any other embodiment of the present disclosure. Any or all of any embodiment of the present disclosure may be combined with any or all of any other embodiment of the present disclosure to create new embodiments of the present disclosure.

Those skilled in the art will recognize improvements and modifications to the preferred embodiments of the present disclosure. All such improvements and modifications are considered within the scope of the concepts disclosed herein and the claims that follow.

What is claimed is:

1. A passive multi-band duplexer comprising:
a first plurality of sub-band bandpass filters, such that each of the first plurality of sub-band bandpass filters is coupled between a common port and a first switching circuit;
the first switching circuit adapted to electrically couple a selected one of the first plurality of sub-band bandpass filters to a first tunable LC bandpass filter;
the first tunable LC bandpass filter coupled between a first port and the first switching circuit;
a second plurality of sub-band bandpass filters, such that each of the second plurality of sub-band bandpass filters is coupled between the common port and a second switching circuit;
the second switching circuit adapted to electrically couple a selected one of the second plurality of sub-band bandpass filters to a second tunable LC bandpass filter;
the second tunable LC bandpass filter coupled between a second port and the second switching circuit; and
control circuitry adapted to select the one of the first plurality of sub-band bandpass filters, select the one of the second plurality of sub-band bandpass filters, tune the first tunable LC bandpass filter and tune the second tunable LC bandpass filter, such that a fixed passband center frequency of the selected one of the first plurality of sub-band bandpass filters is about equal to a tunable passband center frequency of the first tunable LC bandpass filter and a fixed passband center frequency of the selected one of the second plurality of sub-band bandpass filters is about equal to a tunable passband center frequency of the second tunable LC bandpass filter.

2. The passive multi-band duplexer of claim 1 wherein:
the first plurality of sub-band bandpass filters, the first switching circuit, and the first tunable LC band pass filter form a first bandpass filter having a first bandpass filter response, which is shaped by the first tunable LC band pass filter; and
the second plurality of sub-band bandpass filters, the second switching circuit, and the second tunable LC band pass filter form a second bandpass filter having a second bandpass filter response, which is shaped by the second tunable LC band pass filter.

3. The passive multi-band duplexer of claim 2 wherein the common port is an antenna port, the first port is a transmitter port, and the second port is a receiver port.

4. The passive multi-band duplexer of claim 3 wherein each of the first plurality of sub-band bandpass filters is associated with a corresponding each of a plurality of transmitter sub-bands and each of the second plurality of sub-band bandpass filters is associated with a corresponding each of a plurality of receiver sub-bands.

5. The passive multi-band duplexer of claim 3 wherein:
the passive multi-band duplexer is adapted to receive and filter an RF receive signal from an antenna via the antenna port to provide a filtered RF receive signal to receiver circuitry via the receiver port; and
the passive multi-band duplexer is further adapted to receive and filter an RF transmit signal from transmitter circuitry via the transmitter port to provide a filtered RF transmit signal to the antenna via the antenna port.

6. The passive multi-band duplexer of claim 2 wherein the RF transmit signal and the RF receive signal are full-duplex signals, such that the RF transmit signal and the RF receive signal are simultaneously transmitted and received, respectively.

7. The passive multi-band duplexer of claim 2 wherein:
all of the first plurality of sub-band bandpass filters other than the selected one of the first plurality of sub-band bandpass filters are isolated from the first tunable LC bandpass filter; and
all of the second plurality of sub-band bandpass filters other than the selected one of the second plurality of sub-band bandpass filters are isolated from the second tunable LC bandpass filter.

8. The passive multi-band duplexer of claim 2 wherein:
each of the first plurality of sub-band bandpass filters comprises a plurality of fixed resonating elements; and
each of the second plurality of sub-band bandpass filters comprises a plurality of fixed resonating elements.

9. The passive multi-band duplexer of claim 8 wherein:
the plurality of fixed resonating elements of the each of the first plurality of sub-band bandpass filters comprises surface acoustic wave (SAW) resonating elements; and
the plurality of fixed resonating elements of the each of the second plurality of sub-band bandpass filters comprises SAW resonating elements.

10. The passive multi-band duplexer of claim 8 wherein:
the plurality of fixed resonating elements of the each of the first plurality of sub-band bandpass filters comprises bulk acoustic wave (BAW) resonating elements; and
the plurality of fixed resonating elements of the each of the second plurality of sub-band bandpass filters comprises BAW resonating elements.

11. The passive multi-band duplexer of claim 8 wherein:
the plurality of fixed resonating elements of the each of the first plurality of sub-band bandpass filters comprises at least one series resonating element coupled in series between the common port and the first switching circuit and at least one shunt resonating element, such that each of the at least one shunt resonating element is coupled to at least one selected from a group consisting of the first switching circuit, the common port, and a corresponding junction between a pair of the at least one series resonating element that are coupled in series between the common port and the first switching circuit; and
the plurality of fixed resonating elements of the each of the second plurality of sub-band bandpass filters comprises at least one series resonating element coupled in series between the common port and the second switching circuit and at least one shunt resonating element, such that each of the at least one shunt resonating element is coupled to at least one selected from a group consisting of the second switching circuit, the common port, and a corresponding junction between a pair of the at least one series resonating element that are coupled in series between the common port and the second switching circuit.

12. The passive multi-band duplexer of claim 11 wherein:
each series resonating element of the each of the first plurality of sub-band bandpass filters has an anti-resonant frequency, which determines an upper passband edge of the each of the first plurality of sub-band bandpass filters, and each shunt resonating element of the each of the first plurality of sub-band bandpass filters has a resonant frequency, which determines a lower passband edge of the each of the first plurality of sub-band bandpass filters; and
each series resonating element of the each of the second plurality of sub-band bandpass filters has an anti-resonant frequency, which determines an upper passband edge of the each of the second plurality of sub-band bandpass filters, and each shunt resonating element of the each of the second plurality of sub-band bandpass filters has a resonant frequency, which determines a lower passband edge of the each of the second plurality of sub-band bandpass filters.

13. The passive multi-band duplexer of claim 11 wherein:
one of the at least one shunt resonating element of the plurality of fixed resonating elements of the each of the first plurality of sub-band bandpass filters is coupled to the common port; and
one of the at least one shunt resonating element of the plurality of fixed resonating elements of the each of the second plurality of sub-band bandpass filters is coupled to the common port.

14. The passive multi-band duplexer of claim 11 wherein:
one of the at least one shunt resonating element of the plurality of fixed resonating elements of the each of the first plurality of sub-band bandpass filters is coupled to the first switching circuit; and
one of the at least one shunt resonating element of the plurality of fixed resonating elements of the each of the second plurality of sub-band bandpass filters is coupled to the second switching circuit.

15. The passive multi-band duplexer of claim 8 wherein:
each of the plurality of fixed resonating elements of the each of the first plurality of sub-band bandpass filters does not include any tank circuits; and
each of the plurality of fixed resonating elements of the each of the second plurality of sub-band bandpass filters does not include any tank circuits.

16. The passive multi-band duplexer of claim 2 wherein:
the first switching circuit comprises a first plurality of micro-electro-mechanicalsystems (MEMS) switching elements, such that each of the first plurality of MEMS switching elements is coupled between a corresponding each of the first plurality of sub-band bandpass filters and the first tunable LC bandpass filter; and
the second switching circuit comprises a second plurality of MEMS switching elements, such that each of the second plurality of MEMS switching elements is coupled between a corresponding each of the second plurality of sub-band bandpass filters and the second tunable LC bandpass filter.

17. The passive multi-band duplexer of claim 2 wherein further comprising:
a first plurality of passive networks, such that each of the first plurality of passive networks is coupled between a corresponding each of the first plurality of sub-band bandpass filters and the first switching circuit and the selected one of the first plurality of sub-band bandpass filters is electrically coupled to the first tunable LC bandpass filter through a corresponding one of the first plurality of passive networks; and
a second plurality of passive networks, such that each of the second plurality of passive networks is coupled between a corresponding each of the second plurality of sub-band bandpass filters and the second switching circuit and the selected one of the second plurality of sub-band bandpass filters is electrically coupled to the second tunable LC bandpass filter through a corresponding one of the second plurality of passive networks.

18. The passive multi-band duplexer of claim 2 wherein:
the first tunable LC bandpass filter comprises a first series tank circuit coupled between the first switching circuit and the first port and a first shunt tank circuit coupled to the first port; and
the second tunable LC bandpass filter comprises a second series tank circuit coupled between the second switching circuit and the second port and a second shunt tank circuit coupled to the second port.

19. The passive multi-band duplexer of claim 18 wherein:
the first series tank circuit comprises a first inductive element and a first capacitance circuit;
the first shunt tank circuit comprises a second inductive element and a second capacitance circuit;
the second series tank circuit comprises a third inductive element and a third capacitance circuit; and
the second shunt tank circuit comprises a fourth inductive element and a fourth capacitance circuit.

20. The passive multi-band duplexer of claim 19 wherein the first capacitance circuit, the second capacitance circuit, the third capacitance circuit, and the fourth capacitance circuit are all tunable capacitance circuits.

21. The passive multi-band duplexer of claim 20 wherein:
the first capacitance circuit comprises a first plurality of capacitive elements and a first plurality of micro-electromechanicalsystems (MEMS) switching elements, such that each of the first plurality of capacitive elements is coupled in series with a corresponding each of the first plurality of MEMS switching elements;
the second capacitance circuit comprises a second plurality of capacitive elements and a second plurality of MEMS switching elements, such that each of the second plurality of capacitive elements is coupled in series with a corresponding each of the second plurality of MEMS switching elements;
the third capacitance circuit comprises a third plurality of capacitive elements and a third plurality of MEMS switching elements, such that each of the third plurality of capacitive elements is coupled in series with a corresponding each of the third plurality of MEMS switching elements; and
the fourth capacitance circuit comprises a fourth plurality of capacitive elements and a fourth plurality of MEMS switching elements, such that each of the fourth plurality of capacitive elements is coupled in series with a corresponding each of the fourth plurality of MEMS switching elements.

22. The passive multi-band duplexer of claim 20 wherein:
the first capacitance circuit comprises a first varactor diode element;
the second capacitance circuit comprises a second varactor diode element;
the third capacitance circuit comprises a third varactor diode element; and
the fourth capacitance circuit comprises a fourth varactor diode element.

23. The passive multi-band duplexer of claim 20 wherein:
the first capacitance circuit is coupled across the first inductive element;
the second capacitance circuit is coupled across the second inductive element;
the third capacitance circuit is coupled across the third inductive element; and
the fourth capacitance circuit is coupled across the fourth inductive element.

24. The passive multi-band duplexer of claim 20 wherein:
the first capacitance circuit comprises a first plurality of MEMS selectable capacitance elements;
the second capacitance circuit comprises a second plurality of MEMS selectable capacitance elements;
the third capacitance circuit comprises a third plurality of MEMS selectable capacitance elements; and
the fourth capacitance circuit comprises a fourth plurality of MEMS selectable capacitance elements.

25. The passive multi-band duplexer of claim 19 wherein:
the first series tank circuit further comprises a fifth capacitance circuit coupled in series with the first inductive element, such that the first capacitance circuit is coupled across the series coupling of the fifth capacitance circuit and the first inductive element;
the first shunt tank circuit further comprises a sixth capacitance circuit coupled in series with the second inductive element, such that the second capacitance circuit is coupled across the series coupling of the sixth capacitance circuit and the second inductive element;
the second series tank circuit further comprises a seventh capacitance circuit coupled in series with the third inductive element, such that the third capacitance circuit is coupled across the series coupling of the seventh capacitance circuit and the third inductive element; and
the second shunt tank circuit further comprises an eighth capacitance circuit coupled in series with the fourth inductive element, such that the fourth capacitance circuit is coupled across the series coupling of the eighth capacitance circuit and the fourth inductive element.

26. The passive multi-band duplexer of claim 25 wherein the first capacitance circuit, the second capacitance circuit, the third capacitance circuit, and the fourth capacitance circuit are all tunable capacitance circuits.

27. The passive multi-band duplexer of claim 26 wherein the fifth capacitance circuit, the sixth capacitance circuit, the seventh capacitance circuit, and the eighth capacitance circuit are all tunable capacitance circuits.

28. The passive multi-band duplexer of claim 25 wherein the fifth capacitance circuit, the sixth capacitance circuit, the seventh capacitance circuit, and the eighth capacitance circuit are all tunable capacitance circuits.

29. A method comprising:
providing a first plurality of sub-band bandpass filters coupled between a common port and a first switching circuit;
providing a first tunable LC bandpass filter coupled between a first port and the first switching circuit;
providing a second plurality of sub-band bandpass filters coupled between the common port and a second switching circuit;
providing a second tunable LC bandpass filter coupled between a second port and the second switching circuit;
selecting and electrically coupling one of the first plurality of sub-band bandpass filters to the first tunable LC bandpass filter via the first switching circuit;

selecting and electrically coupling one of the second plurality of sub-band bandpass filters to the second tunable LC bandpass filter via the second switching circuit; and tuning the first tunable LC bandpass filter and the second tunable LC bandpass filter, such that a fixed passband center frequency of the selected and electrically coupled one of the first plurality of sub-band bandpass filters is about equal to a tunable passband center frequency of the first tunable LC bandpass filter and a fixed passband center frequency of the selected and electrically coupled one of the second plurality of sub-band bandpass filters is about equal to a tunable passband center frequency of the second tunable LC bandpass filter.

* * * * *